(12) United States Patent
Miyakawa et al.

(10) Patent No.: US 7,209,398 B2
(45) Date of Patent: Apr. 24, 2007

(54) SEMICONDUCTOR MEMORY DEVICE HAVING REDUNDANCY CELL ARRAY SHARED BY A PLURALITY OF MEMORY CELL ARRAYS

(75) Inventors: Tadashi Miyakawa, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 312 days.

(21) Appl. No.: 10/879,100

(22) Filed: Jun. 30, 2004

(65) Prior Publication Data

US 2005/0232035 A1 Oct. 20, 2005

(30) Foreign Application Priority Data

Apr. 16, 2004 (JP) .............................. 2004-121751

(51) Int. Cl.
*G11C 29/00* (2006.01)
*G11C 7/00* (2006.01)
(52) U.S. Cl. ....................................... 365/200; 365/145
(58) Field of Classification Search ................. 365/200
See application file for complete search history.

(56) References Cited

U.S. PATENT DOCUMENTS

| | | | | |
|---|---|---|---|---|
| 5,023,839 A * | 6/1991 | Suzuki et al. | ........... | 365/185.21 |
| 5,808,944 A * | 9/1998 | Yoshitake et al. | .......... | 365/200 |
| 6,151,242 A * | 11/2000 | Takashima | ................... | 365/145 |
| 6,246,616 B1 * | 6/2001 | Nagai et al. | ................ | 365/200 |
| 6,392,938 B1 * | 5/2002 | Choi et al. | .................. | 365/200 |
| 6,404,683 B1 * | 6/2002 | Yumoto | ....................... | 365/200 |

OTHER PUBLICATIONS

Takashima, Daisaburo and Kunishima, Iwao High-Density Chain Ferroelectric Random Access Memory (Chain FRAM) IEEE Journal of Solid-State Circuits, vol. 33, No. 5, May 1998, pp. 787-792.*
Toshiaki Kirihata, et al., "Fault-Tolerant Designs for 256 Mb DRAM", IEEE Journal of Solid State Circuit, vol. 31, No. 4, Apr. 1996, pp. 558-566.
Daisaburo Takashima, et al., A 76mm$^2$ 8Mb Chain Ferroelectric Memory, Non-Volatile Memories, ISSCC 2001, Session 2, 2.7, pp. 40-41.

* cited by examiner

*Primary Examiner*—Amir Zarabian
*Assistant Examiner*—Kretelia Graham
(74) *Attorney, Agent, or Firm*—Oblon, Spivak, McClelland, Maier & Neustadt, P.C.

(57) ABSTRACT

A semiconductor memory device includes memory cell arrays, a redundancy cell array shared by the memory cell arrays, a correction capacitance, and switching circuits arranged in correspondence with the memory cell arrays. Each memory cell array includes ferroelectric cells arranged at the intersections between word lines and bit lines. The redundancy cell array includes spare ferroelectric cells arranged at the intersections between spare word lines and redundancy bit lines. The number of spare ferroelectric cells connected to the redundancy bit line is smaller than that of ferroelectric cells connected to the bit line in each memory cell array. The correction capacitance is connected to the redundancy bit line to make its capacitance equivalent to that of the bit line. When a replaced ferroelectric cell in the memory cell array is selected, the switching circuits select a corresponding spare ferroelectric cell in place of the replaced ferroelectric cell.

18 Claims, 17 Drawing Sheets

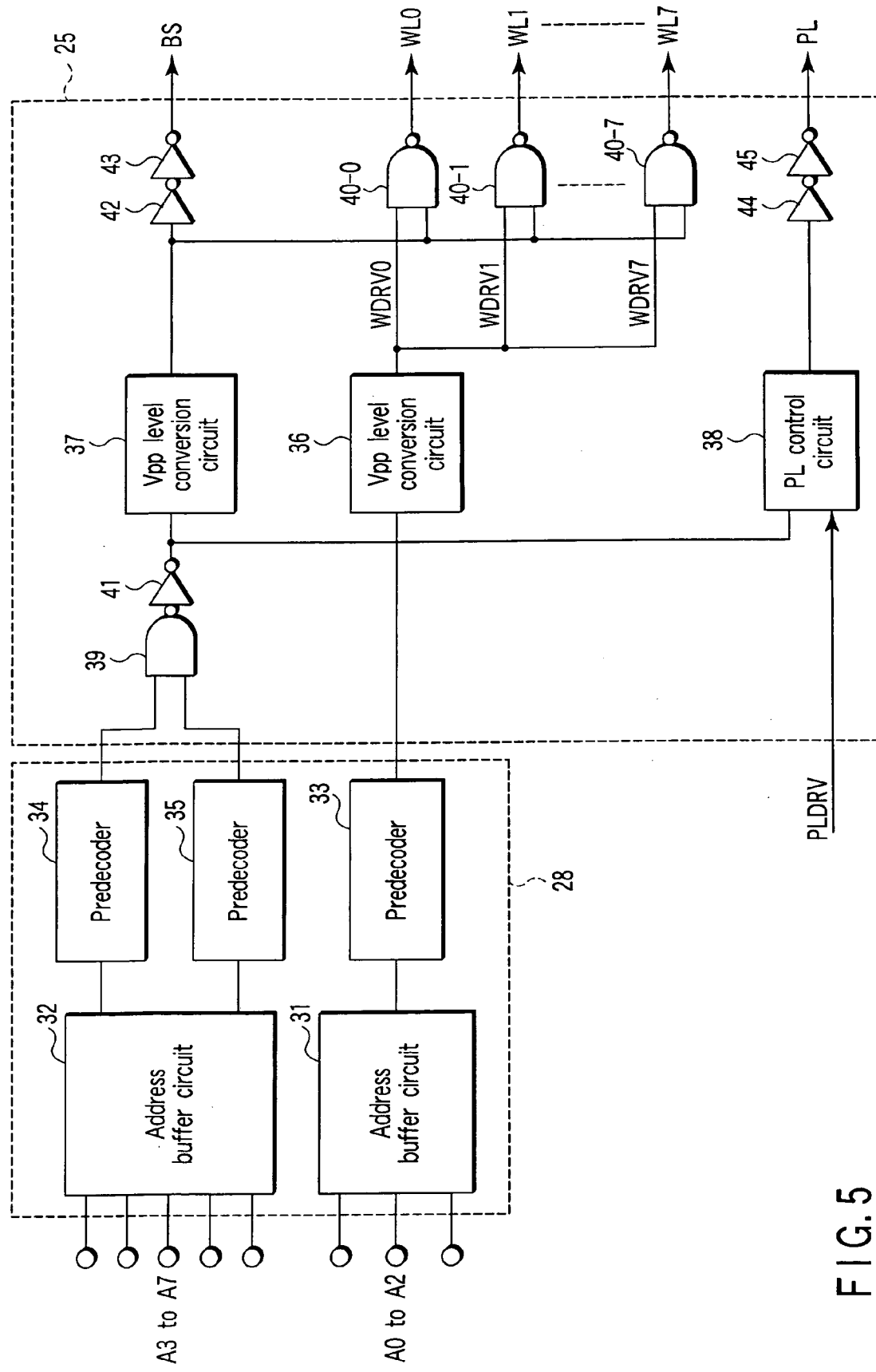
F I G. 5

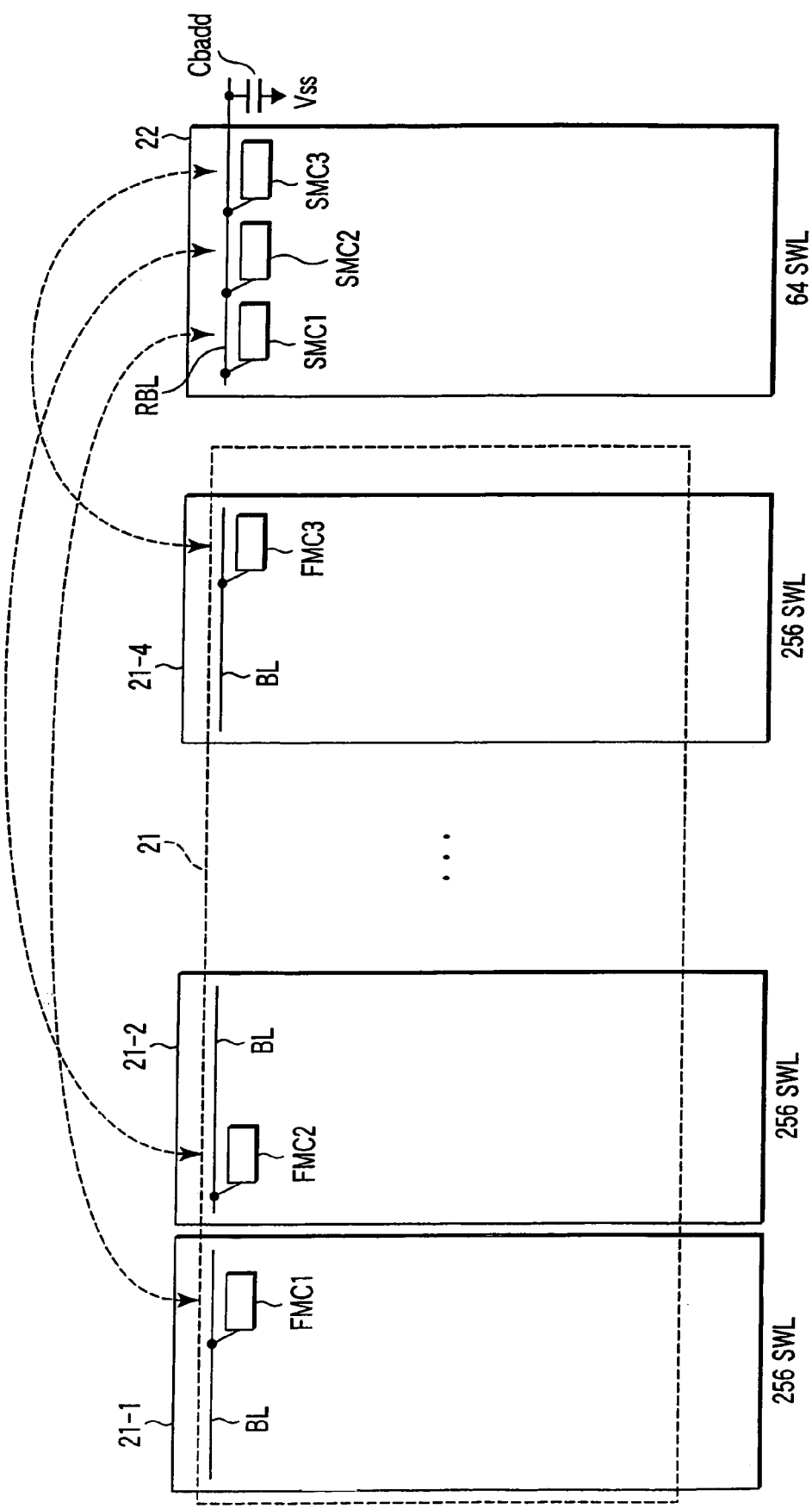
F I G. 8

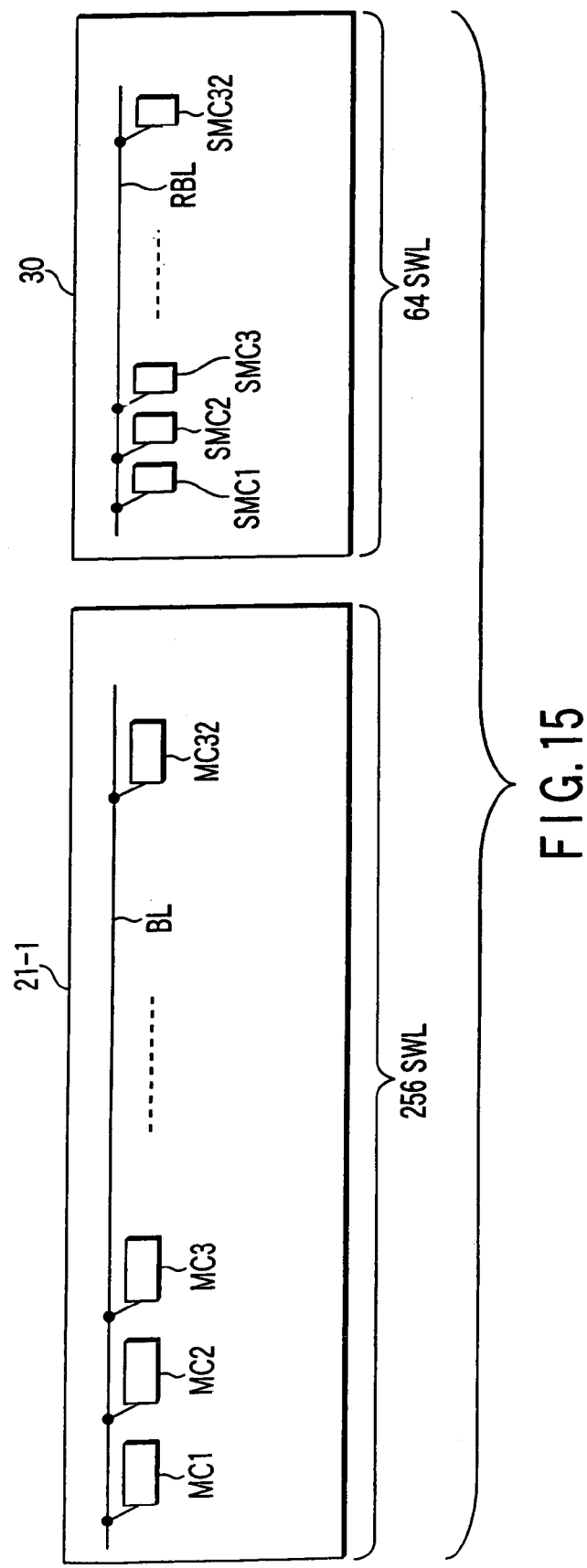
F I G. 15

SEMICONDUCTOR MEMORY DEVICE HAVING REDUNDANCY CELL ARRAY SHARED BY A PLURALITY OF MEMORY CELL ARRAYS

CROSS-REFERENCE TO RELATED APPLICATIONS

This application is based upon and claims the benefit of priority from prior Japanese Patent Application No. 2004-121751, filed Apr. 16, 2004, the entire contents of which are incorporated herein by reference.

BACKGROUND OF THE INVENTION

1. Field of the Invention

The present invention relates to a semiconductor memory device and, more particularly, to a redundancy technique in a ferroelectric memory.

2. Description of the Related Art

For semiconductor memory devices, a technique (redundancy technique) for increasing the manufacturing yield is indispensable. In such a technique, redundancy spare cells are prepared in addition to primary memory cells of a necessary capacity, and defective memory cells are replaced with the spare cells for remedy.

A ferroelectric memory employs a method of arranging memory cells to be selected by a word line and spare cells to be selected by a spare word line on the same bit line so that a defective cell is replaced with a spare cell on the same bit line. In this redundancy method, if a plurality of defective cells appear on one bit line, only cells equal in number to spare word lines (spare rows) formed in advance are replaced. In addition, remedy is possible in only the same memory cell array. If defective cells concentrate in a specific memory cell array, some defective cells cannot be remedied by a corresponding redundancy cell array. However, the remaining defective cells cannot be remedied by spare cells in another memory cell array having no defective cells.

In a DRAM having a memory cell structure similar to a ferroelectric cell, an independent redundancy cell array having a smaller capacity than a main cell array is prepared outside it. Since this redundancy cell array can be replaced with unspecified memory cell arrays, the remedy efficiency increases. The bit line length in such an independent redundancy cell array having a small capacity is smaller than that in each memory cell array in the main cell array. For this reason, the bit line capacitance of the redundancy cell array is lower than that in the main cell array. In the DRAM, when the bit line capacitance decreases, the cell signal amount in a read increases. Hence, no problem arises in the sense operation in the read.

In a ferroelectric memory, however, when the bit line capacitance reaches a predetermined value, the read signal amount decreases independently of the decrease/increase in bit line capacitance in a graph having an abscissa representing the bit line capacitance and an ordinate representing the read signal amount, as shown in, e.g., FIG. 2.7.5(b) of Takashima D., et al., "A 76 mm² 8 Mb Chain Ferroelectric Memory", 2001 IEEE International Solid-State Circuits Conference DIGEST OF TECHNICAL PAPERS (ISSCC 2001/SESSION2/NON-VOLATILE MEMORIES/2.7 pp. 40–41). Especially when the bit line capacitance becomes low, the decrease in signal amount is large.

For this reason, in a ferroelectric memory, if remedy is effected by using an independent redundancy cell array having a smaller capacity than the main cell array, the read signal amount decreases as the bit line capacitance decreases. As a result, operation errors may occur in a data read. Hence, the flexible redundancy technique cannot be used in a ferroelectric memory, unlike a DRAM.

BRIEF SUMMARY OF THE INVENTION

According to an aspect of the present invention, there is provided a semiconductor memory device comprising a main cell array which includes a plurality of memory cell arrays, the memory cell arrays having ferroelectric cells arranged at intersections between word lines and bit lines, a redundancy cell array which is arranged independently of the main cell array and shared by the plurality of memory cell arrays, the redundancy cell array having spare ferroelectric cells arranged at intersections between spare word lines and redundancy bit lines, the spare ferroelectric cells connected to the redundancy bit line being smaller in number than the ferroelectric cells connected to the bit line in memory cell arrays in the main cell array, a correction capacitance which is connected to the redundancy bit line to make a capacitance of the redundancy bit line equivalent to that of the bit line, and switching circuits which are arranged in correspondence with the memory cell arrays and configured to, when a replaced ferroelectric cell in the main cell array is selected, select a corresponding spare ferroelectric cell in place of the replaced ferroelectric cell.

According to another aspect of the present invention, there is provided a semiconductor memory device comprising a main cell array which includes a plurality of memory cell arrays, the memory cell arrays having ferroelectric cells arranged at intersections between word lines and bit lines, a redundancy cell array which is arranged independently of the main cell array and shared by the plurality of memory cell arrays, the redundancy cell array having spare ferroelectric cells arranged at intersections between spare word lines and redundancy bit lines, the spare ferroelectric cells connected to the redundancy bit line being smaller in number than the ferroelectric cells connected to the bit line in memory cell arrays in the main cell array, and the redundancy cell array including a plurality of redundancy bit lines which are connected in series to make a capacitance of the bit line equivalent to that of the redundancy bit line, and switching circuits which are arranged in correspondence with the memory cell arrays and configured to, when a replaced ferroelectric cell in the main cell array is selected, select a corresponding spare ferroelectric cell in place of the replaced ferroelectric cell.

According to still another aspect of the present invention, there is provided a semiconductor memory device comprising a main cell array which includes a plurality of memory cell arrays, the memory cell arrays having ferroelectric cells arranged at intersections between word lines and bit lines, the ferroelectric cells comprising i first unit cells connected in series, and a first block select transistor which selects the first unit cells, and the first unit cells having a cell transistor and a ferroelectric capacitor whose two terminals are connected between a source and a drain of the cell transistor, a redundancy cell array which is arranged independently of the main cell array and shared by the plurality of memory cell arrays, the redundancy cell array having spare ferroelectric cells arranged at intersections between spare word lines and redundancy bit lines, the spare ferroelectric cells comprising j (j<i) second unit cells connected in series, and a second block select transistor which selects the second unit cells, and the second unit cells having a cell transistor and a ferroelectric capacitor whose two terminals are connected between a source and a drain of the cell transistor, and switching circuits which are arranged in correspondence with the memory cell arrays and configured to, when a replaced ferroelectric cell in the main cell array is selected, select a corresponding spare ferroelectric cell in place of the replaced ferroelectric cell, wherein the first block select transistors connected to bit lines in memory cell arrays in the main cell array are equal in number to the second block select transistors connected to redundancy bit lines in the redundancy cell array.

BRIEF DESCRIPTION OF THE SEVERAL VIEWS OF THE DRAWING

FIG. 5 is a circuit diagram showing the detailed arrangement of an address buffer circuit and row decoder/PL control circuit in the circuit shown in FIG. 2;

FIG. 8 is a view for explaining a replacement operation by redundancy according to the first embodiment of the present invention;

FIG. 15 is a view for explaining the structures of a main cell array and a redundancy cell array in the circuit shown in FIG. 14;

DETAILED DESCRIPTION OF THE INVENTION

Figure 1:
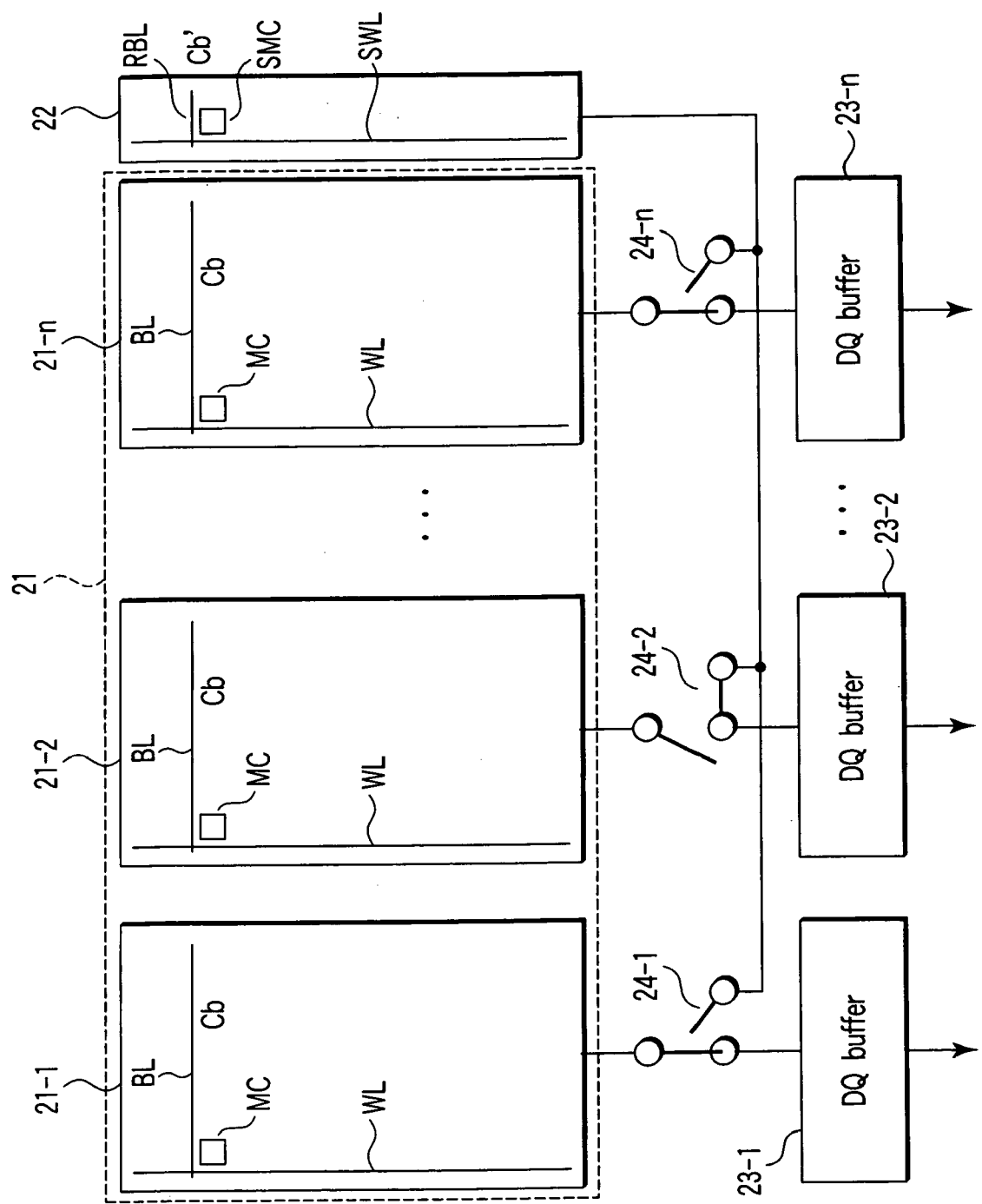
FIG. 1 is a block diagram showing the concept of redundancy in a ferroelectric memory so as to explain a semiconductor memory device according to an embodiment of the present invention.

FIG. 1 is a block diagram showing the concept of redundancy in a ferroelectric memory so as to explain a semiconductor memory device according to an embodiment of the present invention. A main cell array 21 includes a plurality of (n) memory cell arrays 21-1, 21-2, . . . , 21-n. An independent redundancy cell array 22 is prepared adjacent to the main cell array 21. FIG. 1 mainly shows a word line WL, spare word line SWL, bit line BL, redundancy bit line RBL, memory cell MC, and spare cell SMC. Actually, a large number of word lines WL, spare word lines, and bit lines BL are arranged in each memory cell array or the redundancy cell array. The memory cells MC and spare cells SMC are arranged in an array. A capacitance Cb of the bit line BL in each of the memory cell arrays 21-1, 21-2, . . . , 21-n is set to be equivalent to a capacitance Cb' of the redundancy bit line RBL in the redundancy cell array 22. The read signal amount of the memory cell MC almost equals that of the spare cell SMC.

DQ buffers 23-1, 23-2, . . . , 23-n are arranged in correspondence with the memory cell arrays 21-1, 21-2, . . . , 21-n. Switching circuits 24-1, 24-2, . . . , 24-n are arranged between the memory cell arrays 21-1, 21-2, . . . , 21-n and the DQ buffers 23-1, 23-2, . . . , 23-n, respectively. When a defective cell is accessed, one of the switching circuits 24-1, 24-2, . . . , 24-n is ON/OFF-controlled to select data read out from the redundancy bit line RBL in the redundancy cell array 22 and supply the data to a corresponding one of the DQ buffers 23-1, 23-2, . . . , 23-n in place of data read out through the bit line BL in the memory cell arrays 21-1, 21-2, . . . , 21-n.

In the above arrangement, replacement of a defective cell and a spare cell is done for each word line. When the word line WL connected to a defective cell in the memory cell arrays 21-1, 21-2, . . . , 21-n is selected, a spare word line SWL connected to a corresponding spare cell SMC in the redundancy cell array 22 is selected in place of the row address. When a defective cell in the memory cell arrays 21-1, 21-2, . . . , 21-n is selected, not data read out through the bit line BL connected to the defective cell but data which is read out from the redundancy bit line RBL connected to the replaced spare cell SMC in the redundancy cell array 22 is supplied by one of the switching circuits 24-1, 24-2, . . . , 24-n to a corresponding one of the DQ buffers 23-1, 23-2, . . . , 23-n. At this time, since the bit line capacitance Cb' of the redundancy cell array 22 is equivalent to the redundancy bit line capacitance Cb of the main cell array 21, the read signal amount does not decrease.

With the above architecture, even when redundancy remedy is done by arranging the independent redundancy cell array 22 having a smaller capacity than the main cell array 21, a stable read operation can be implemented. In addition, since the redundancy cell array 22 is shared by the memory cell arrays 21-1, 21-2, . . . , 21-n, flexible redundancy is possible, and the remedy efficiency can be increased.

Detailed arrangements to implement the above-described redundancy operation and their operations will be described next in detail in accordance with the first to third embodiments.

An example of a ferroelectric memory (called a TC parallel unit series-connected ferroelectric memory) will be described here. In this ferroelectric memory, the two terminals of a capacitor (C) are connected between the source and the drain of a cell transistor (T) to form a unit cell, and a plurality of unit cells are connected in series. For descriptive convenience, the main cell array includes four memory cell arrays, and 4-bit data is input/output to/from each memory cell array.

[First Embodiment]

Figure 2:
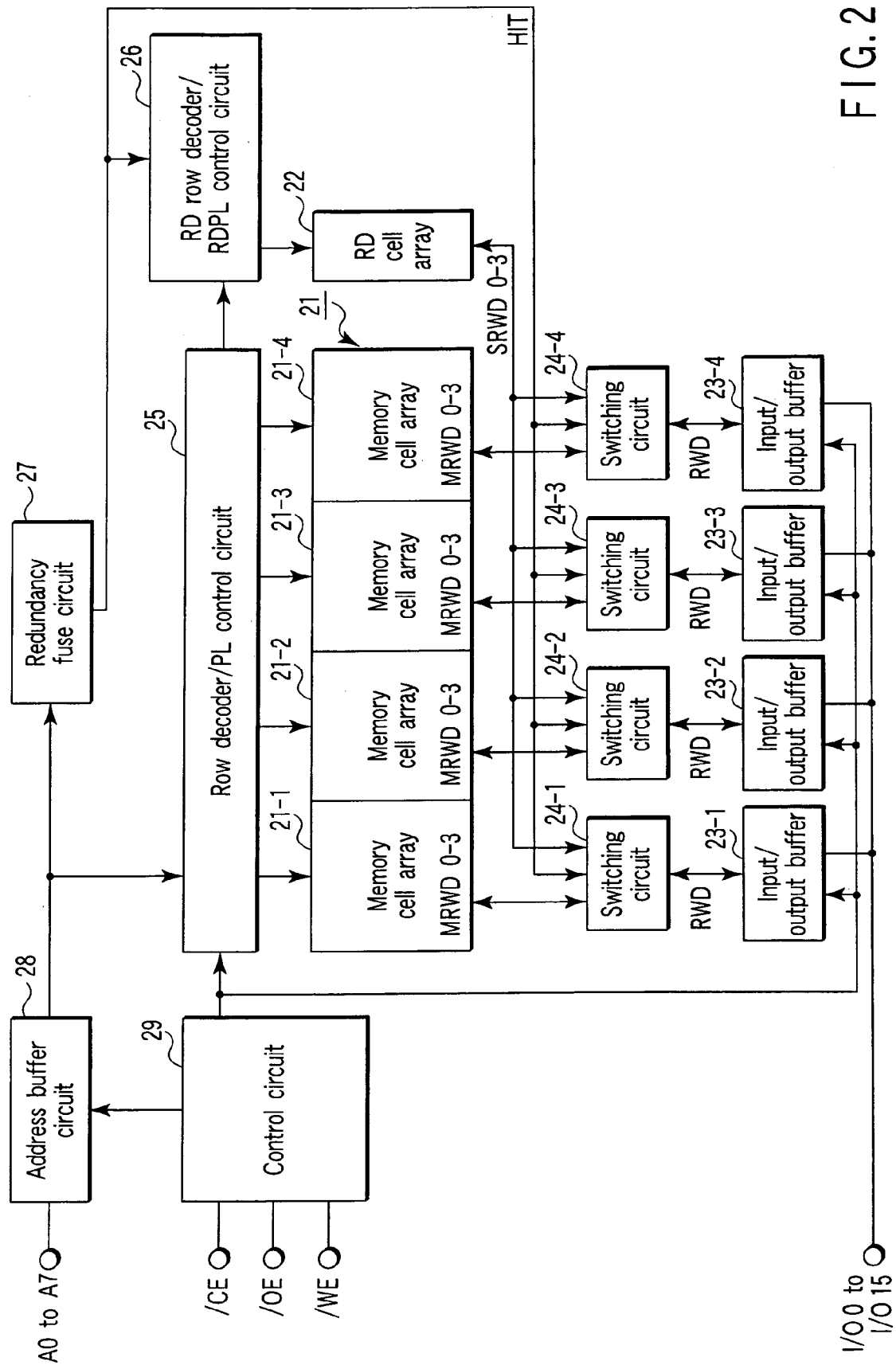
FIG. 2 is a block diagram showing the schematic arrangement of a circuit unit related to redundancy in a ferroelectric memory so as to explain a semiconductor memory device according to the first embodiment of the present invention.

FIG. 2 is a block diagram showing the schematic arrangement of a circuit unit related to redundancy in a ferroelectric memory so as to explain a semiconductor memory device according to the first embodiment of the present invention. This circuit includes a main cell array 21, RD (redundancy) cell array 22, input/output buffers 23-1 to 23-4, switching circuits 24-1 to 24-4, row decoder/PL control circuit 25, RD row decoder/RDPL control circuit 26, redundancy fuse circuit 27, address buffer circuit 28, and control circuit 29.

Address signal bits A0 to A7 are input to the address buffer circuit 28. The output signal from the address buffer circuit 28 is supplied to the redundancy fuse circuit 27 and row decoder/PL control circuit 25. A chip enable signal /CE, output enable signal /OE, and write enable signal /WE are supplied to the control circuit 29. The control circuit 29 controls the address buffer circuit 28, row decoder/PL control circuit 25, and input/output buffers 23-1 to 23-4. The output signal from the redundancy fuse circuit 27 is supplied to the row decoder/PL control circuit 25, RD row decoder/RDPL control circuit 26, and switching circuits 24-1 to 24-4. Output signals from the row decoder/PL control circuit 25 are supplied to memory cell arrays 21-1 to 21-4 in the main cell array 21. One (word line driving signal) of the signals output from the row decoder/PL control circuit 25 is supplied to the RD row decoder/RDPL control circuit 26. The output signal from the RD row decoder/RDPL control circuit 26 is supplied to the RD cell array 22.

Data read out from the memory cell arrays 21-1 to 21-4 through main read/write data lines MRWD are supplied to the switching circuits 24-1 to 24-4 and then supplied to the input/output buffers 23-1 to 23-4 through read/write data lines RWD. Data read out from the RD cell array 22 through a spare read/write data line SRWD is supplied to the switching circuits 24-1 to 24-4 and then supplied to the input/output buffers 23-1 to 23-4 through the read/write data lines RWD. Each of the switching circuits 24-1 to 24-4 selects one of the read data on the basis of a signal HIT supplied from the redundancy fuse circuit 27. When one of the address signal bits A0 to A7 input to the address buffer circuit 28 coincides with fuse data (the address of a defective cell, i.e., a block select line and a word line, which select a defective cell to be replaced by redundancy) stored in the redundancy fuse circuit 27 in advance, the signal HIT changes to "H" level. When the address signal bit does not coincide with the fuse data, the signal HIT changes to "L" level. When the signal HIT is at "H" level, the switching circuits 24-1 to 24-4 select data read out from the RD cell array 22 through the spare read/write data line SRWD and supply the data to the input/output buffers 23-1 to 23-4. Conversely, when the signal HIT is at "L" level, the switching circuits 24-1 to 24-4 select data read out from the memory cell arrays 21-1 to 21-4 through the main read/write data lines MRWD and supply the data to the input/output buffers 23-1 to 23-4. The output signals from the input/output buffers 23-1 to 23-4 are output as read data I/O0 to I/O15.

On the other hand, the write data I/O0 to I/O15 input to the input/output buffers 23-1 to 23-4 are supplied to the switching circuits 24-1 to 24-4 through the read/write data lines RWD. As in the read operation, the switching circuits 24-1 to 24-4 select whether the data should be written in the main cell array 21 or RD cell array 22. The data are written in the main cell array 21 or RD cell array 22 through the main read/write data lines MRWD or spare read/write data lines SRWD.

Figure 3:
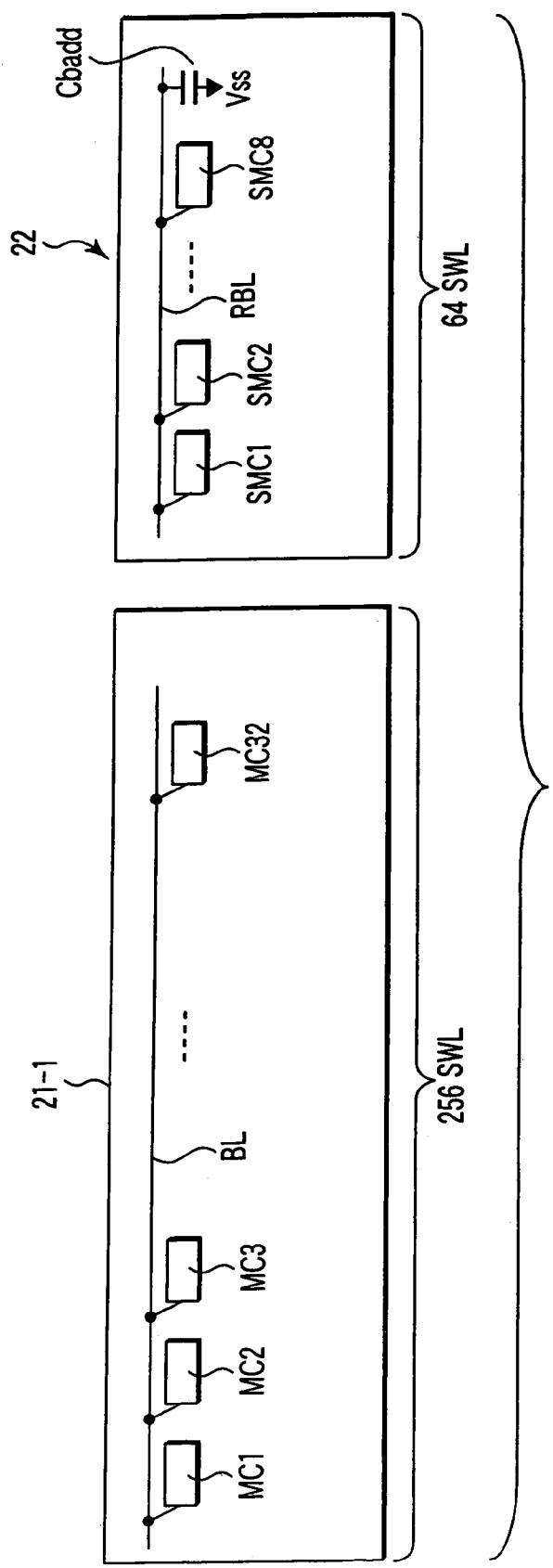
FIG. 3 is a view for explaining the structures of a main cell array and a redundancy cell array in the circuit shown in FIG. 2.

The main cell array 21 of this example includes the four memory cell arrays 21-1 to 21-4. As shown in FIG. 3, 256 word lines WL are arranged in the memory cell array 21-1 (this also applies to the memory cell arrays 21-2 to 21-4). Thirty-two series cells MC1 to MC32 are connected to each of the bit lines BL arranged in a direction perpendicular to the word lines WL. On the other hand, the RD cell array 22 has 64 spare word lines SWL. Eight spare cells (series cells) SMC1 to SMC8 having the same structure as in the memory cell array 21-1 are arranged on each of redundancy bit lines RBL arranged in a direction perpendicular to the spare word lines SWL.

A capacitive element Cbadd is connected between each redundancy bit line RBL and a ground point Vss. That is, in this embodiment, the bit line length in the RD cell array 22 is ¼ that in each of the memory cell arrays 21-1 to 21-4. The redundancy bit line capacitance Cb' is ¼ the bit line capacitance Cb in the main cell array. The capacitive element Cbadd corresponding to ¾ Cb is connected to each redundancy bit line RBL. In this structure, "Cb=Cb'+Cbadd". The bit line capacitance in each of the memory cell arrays 21-1 to 21-4 is equivalent to the redundancy bit line capacitance in the RD cell array 22. Hence, the signal amount read out from the memory cell MC in the main cell array 21 almost equals that read out from the spare cell SMC in the RD cell array 22.

As the capacitive element Cbadd, a ferroelectric capacitor or linear capacitor can be used. A parasitic capacitance generated in the semiconductor integrated circuit device may be used.

Figure 4A:
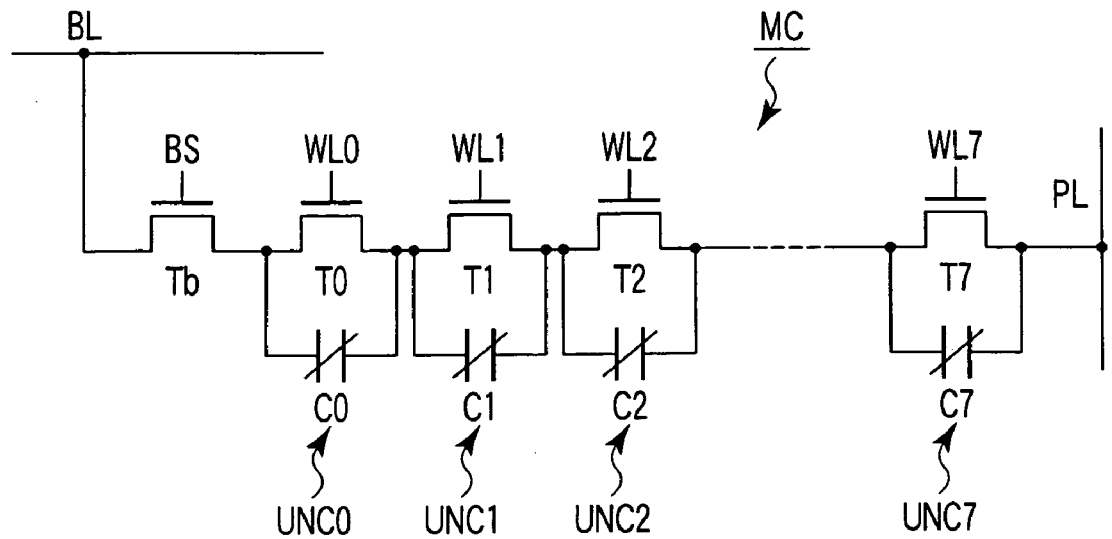
FIG. 4A is a circuit diagram showing the structure of a memory cell in the main cell array in the circuit shown in FIG. 2.

Each series cell MC in the memory cell arrays 21-1 to 21-4 includes unit cells UNC0 to UNC7 connected in series and a block select transistor Tb, as shown in FIG. 4A. In each of the unit cells UNC0 to UNC7, two terminals of a corresponding one of ferroelectric capacitors C0 to C7 are connected between the source and the drain of a corresponding one of cell transistors T0 to T7. In this example, eight unit cells are connected in series. One end of the current path of the block select transistor Tb is connected to the bit line BL. The unit cell UNC7 is connected to a plate line PL arranged in a direction perpendicular to the bit line BL. The gate of the block select transistor Tb is connected to a block select line BS arranged in a direction perpendicular to the bit line BL. The gates of the cell transistors T0 to T7 are connected to word lines WL0 to WL7 arranged in a direction perpendicular to the bit line BL, respectively.

Figure 4B:
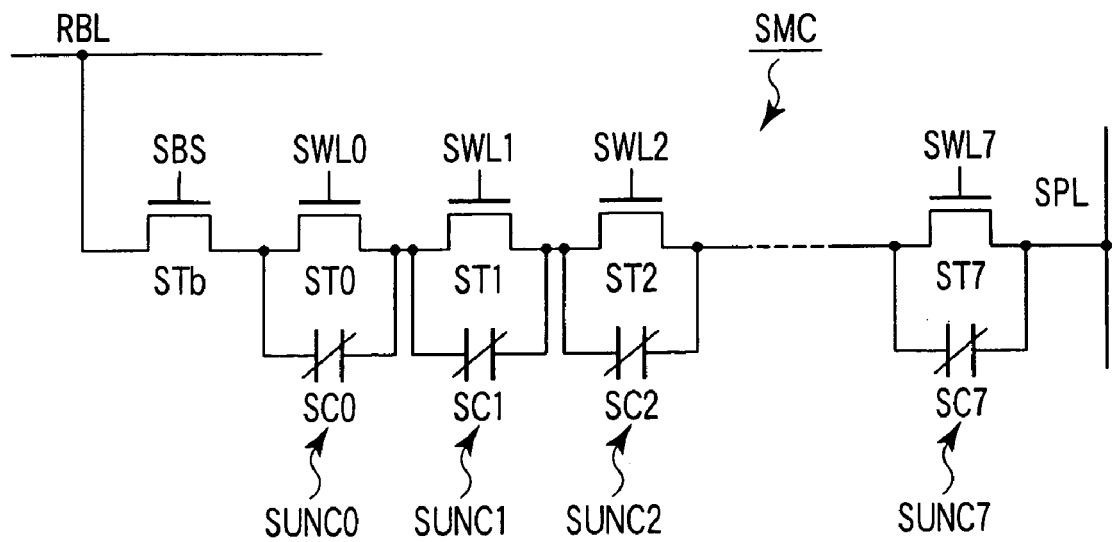
FIG. 4B is a circuit diagram showing the structure of a spare cell in the redundancy cell array in the circuit shown in FIG. 2.

As shown in FIG. 4B, the spare cell SMC in the RD cell array 22 has the same structure as in FIG. 4A. One end of the current path of a block select transistor STb is connected to the redundancy bit line RBL. A unit cell SUNC7 is connected to a plate line SPL arranged in a direction perpendicular to the redundancy bit line RBL. The gate of the block select transistor STb is connected to a block select line SBS arranged in a direction perpendicular to the redundancy bit line RBL. The gates of spare cell transistors ST0 to ST7 are connected to spare word lines SWL0 to SWL7 arranged in a direction perpendicular to the redundancy bit line RBL, respectively.

FIG. 5 shows the detailed arrangement of the address buffer circuit 28 and row decoder/PL control circuit 25 in the circuit shown in FIG. 2. The address buffer circuit 28 includes address buffers 31 and 32 and predecoders 33, 34, and 35. The lower address signal bits A0 to A2 are input to the address buffer 31. The output signal from the address buffer 31 is supplied to the predecoder 33 and decoded. The upper address signal bits A3 to A7 are input to the address buffer 32. The output signals from the address buffer 32 are supplied to the predecoders 34 and 35 and decoded.

The row decoder/PL control circuit 25 includes Vpp level conversion circuits 36 and 37, PL control circuit 38, NAND gates 39 and 40-0 to 40-7, and inverters 41 to 45. The output signal from the predecoder 33 is supplied to the Vpp level conversion circuit 36. The output signals from the predecoders 34 and 35 are supplied to the input terminals of the NAND gate 39. The output signal from the NAND gate 39 is supplied to the Vpp level conversion circuit 37 and PL control circuit 38 through the inverter 41. The output signal from the Vpp level conversion circuit 37 is supplied to one input terminal of each of the NAND gates 40-0 to 40-7 and also supplied to the block select line BS through the inverters 42 and 43. Each of word line driving signals WDRV0 to WDRV7 output from the Vpp level conversion circuit 36 is supplied to the other input terminal of a corresponding one of the NAND gates 40-0 to 40-7. The NAND gates 40-0 to 40-7 output driving signals of the word lines WL0 to WL7. A driving signal PLDRV of the plate line PL is supplied to the PL control circuit 38. The output signal from the PL control circuit 38 is supplied to the plate line PL through the inverters 44 and 45.

Figure 6:
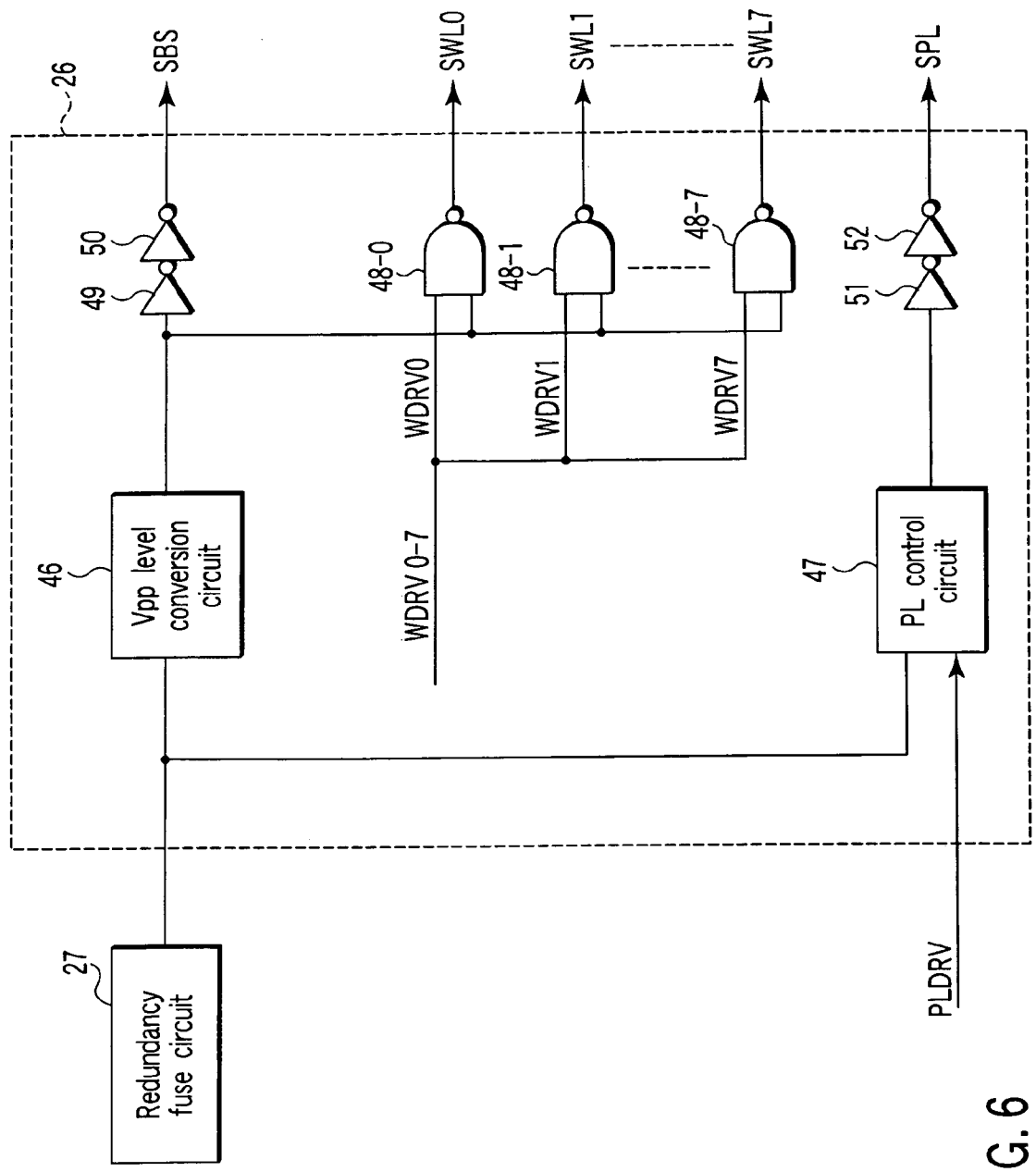
FIG. 6 is a circuit diagram showing the arrangement of an RD row decoder/RDPL control circuit in the circuit shown in FIG. 2.

FIG. 6 shows the arrangement of the RD row decoder/RDPL control circuit 26 in the circuit shown in FIG. 2. The circuit 26 includes a Vpp level conversion circuit 46, PL control circuit 47, NAND gates 48-0 to 48-7, and inverters 49 to 52. The output signal from the redundancy fuse circuit 27 is supplied to the Vpp level conversion circuit 46 and PL control circuit 47. The output signal from the Vpp level conversion circuit 46 is supplied to one input terminal of each of the NAND gates 48-0 to 48-7 and also supplied to the block select line SBS through the inverters 49 and 50. Each of the word line driving signals WDRV0 to WDRV7 output from the Vpp level conversion circuit 36 in the row decoder/PL control circuit 25 is supplied to the other input terminal of a corresponding one of the NAND gates 48-0 to 48-7. The NAND gates 48-0 to 48-7 output driving signals of the spare word lines SWL0 to SWL7. The driving signal PLDRV of the plate line SPL is supplied to the PL control circuit 47. The output signal from the PL control circuit 47 is supplied to the plate line SPL through the inverters 51 and 52.

Figure 7:
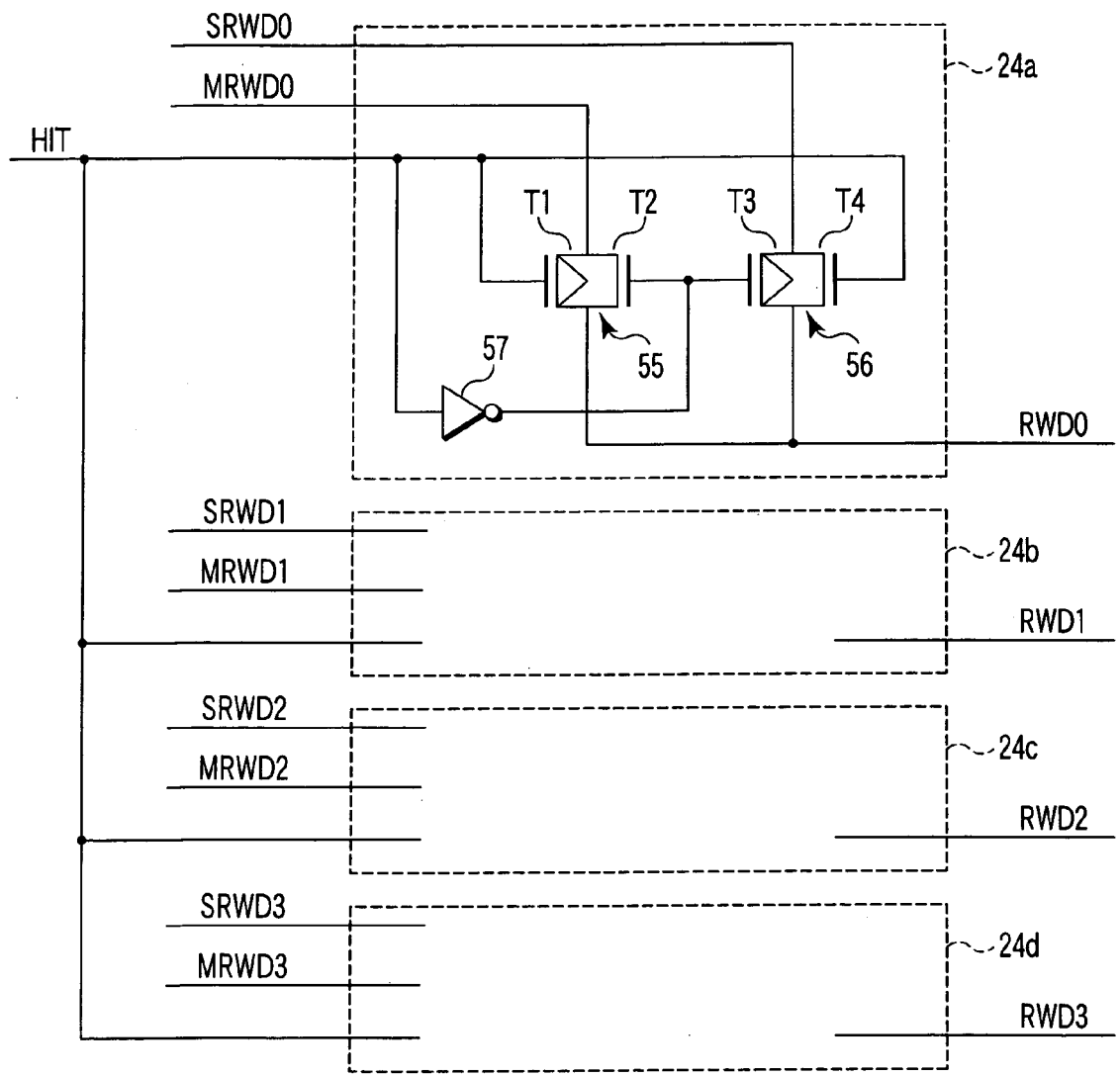
FIG. 7 is a circuit diagram showing the arrangement of a switching circuit in the circuit shown in FIG. 2.

FIG. 7 shows the arrangement of each of the switching circuits 24-1 to 24-4 in the circuit shown in FIG. 2. The switching circuits 24-1 to 24-4 respectively include switch circuits 24a to 24d. Each of the switch circuits 24a to 24d includes a first transfer gate 55 including a PMOS transistor T1 and NMOS transistor T2, a second transfer gate 56 including a PMOS transistor T3 and NMOS transistor T4, and an inverter 57.

Data read out from a memory cell array in the main cell array 21 through a main read/write data line MRWD0 is supplied to one terminal of the transfer gate 55 in the switch circuit 24a. Data read out from the RD cell array 22 through a spare read/write data line SRWD0 is supplied to one terminal of the transfer gate 56. The signal HIT output from the redundancy fuse circuit 27 is supplied to the gates of the MOS transistors T1 and T4. An inverted signal of the signal HIT is supplied from the inverter 57 to the gates of the MOS transistors T2 and T3. Accordingly, the transfer gates 55 and 56 complementarily operate so that one of the data is selected in accordance with the level of the signal HIT.

The remaining switch circuits 24b to 24d also have the same arrangement as that of the switch circuit 24a.

When the signal HIT is at "L" level (no defective cell is accessed), data read out from the memory cell arrays 21-1 to 21-4 to the main read/write data lines MRWD0 to MRWD3 are selected and supplied to the read/write data lines RWD0 to RWD3. On the other hand, when the signal HIT is at "H" level (a defective cell is accessed), data read out from the RD cell array 22 to the spare read/write data lines SRWD0 to SRWD3 are selected and supplied to the read/write data lines RWD0 to RWD3. The data supplied to the read/write data lines RWD0 to RWD3 are supplied to the input/output buffers 23-1 to 23-4.

The operation in the above-described arrangement will be described next. When the main cell array 21 has no defective cell, the main read/write data lines MRWD0 to MRWD3 are selected by the switching circuits 24-1 to 24-4. A data read or write is executed for the memory cells in the main cell array 21.

At this time, as shown in FIG. 5, the memory cell arrays 21-1 to 21-4 in the main cell array 21, the block select line BS to be driven, and the plate line PL to be driven are selected by the address signal bits A3 to A7 input to the address buffer 32. Each of the memory cell arrays 21-1 to 21-4 has a 4-bit I/O structure. Four bit lines BL are simultaneously selected by one address. Hence, four series cells MC connected to four bit lines BL are selected in each of the memory cell arrays 21-1 to 21-4. When the word lines WL0 to WL7 are selectively driven by the address signal bits A0 to A2, the unit cells UNC0 to UNC7 in the four selected series cells MC are selected. The data of the four selected unit cells are supplied from the memory cell array which includes the unit cells to a corresponding one of the switching circuits 24-1 to 24-4 through the main read/write data lines MRWD0 to MRWD3.

When no defective cell is accessed, the signal HIT output from the redundancy fuse circuit 27 is "L" level. Accordingly, the main read/write data lines MRWD0 to MRWD3 are selected by the switching circuits 24-1 to 24-4. Data read out from the selected unit cells are supplied to the input/output buffers 23-1 to 23-4 through the read/write data lines RWD0 to RWD3. As a result, the read data I/O0 to I/O15 are output every 4 bits from the input/output buffers 23-1 to 23-4.

The data write is executed in accordance with reversed procedures. The write data I/O0 to I/O15 are input to the input/output buffers 23-1 to 23-4 and written in the selected unit cells in the memory cell arrays 21-1 to 21-4 through the read/write data lines RWD (RWD0 to RWD3), switching circuits 24-1 to 24-4, and main read/write data lines MRWD0 to MRWD3.

When the main cell array 21 has a defective cell which is not accessed, the read and write operations are executed in the same way as described above.

Conversely, when the main cell array 21 has a defective cell, its address is stored in the redundancy fuse circuit 27. On the basis of the fuse data stored in the redundancy fuse circuit 27, RD row decoder/RDPL control circuit 26, and switching circuits 24-1 to 24-4 are controlled. When the address of the defective cell is accessed, not the defective cell but the spare cell SMC is accessed.

The access operation for the main cell array 21 is the same as described above. The RD row decoder/RDPL control circuit 26 accesses the spare cell in the RD cell array 22 on the basis of the fuse data stored in the redundancy fuse circuit 27. In accordance with the address data of the defective cell, which is stored in the redundancy fuse circuit 27, the block select line SBS to be driven and the plate line SPL to be driven in the RD cell array 22 are selected. Four spare series cells SMC connected to four redundancy bit lines RBL are selected. The spare word lines SWL0 to SWL7 are selectively driven by the NAND of the output signals WDRV0 to WDRV7 from the Vpp level conversion circuit 36 and the output signal from the Vpp level conversion circuit 46 so that unit cells in the four selected spare series cells are selected. The data of the selected unit cells are supplied from the RD cell array 22 to the switching circuits 24-1 to 24-4 through the spare read/write data lines SRWD0 to SRWD3. The switching circuits 24-1 to 24-4 execute the selection operation on the basis of the signal HIT output from the redundancy fuse circuit 27. When the signal HIT is at "H" level, the transfer gate 55 is turned off, and the transfer gate 56 is turned on. Accordingly, the spare read/write data lines SRWD0 to SRWD3 of the spare cell corresponding to the defective cell are selected. The data in the RD cell array 22 is supplied to the read/write data lines RWD (RWD0 to RWD3). The read data I/O0 to I/O15 are output from the input/output buffers 23-1 to 23-4.

The data write is executed in accordance with reversed procedures. The write data I/O0 to I/O15 are input to the input/output buffers 23-1 to 23-4 and written in the selected unit cells in the RD cell array 22 through the read/write data lines RWD (RWD0 to RWD3), switching circuits 24-1 to 24-4, and spare read/write data lines SRWD0 to SRWD3.

As shown in FIG. 8, when the memory cell arrays 21-1, 21-2, and 21-4 have defective cells FMC1, FMC2, and FMC3, respectively, data can be written in or read out from spare cells SMC1, SMC2, and SMC3 in the RD cell array 22 in place of the defective cells FMC1, FMC2, and FMC3. More specifically, the plurality of defective cells FMC1, FMC2, and FMC3 connected to the same bit line BL in different memory cell arrays can be remedied by replacing them with the spare cells SMC1, SMC2, and SMC3 connected to one redundancy bit line RBL.

FIG. 8 shows an example in which the single defective cells FMC1, FMC2, and FMC3 in the memory cell arrays 21-1, 21-2, and 21-4 are remedied. However, defective cells equal in number to the spare cells SMC formed in advance and connected to the redundancy bit line RBL can be replaced.

As described above, according to this embodiment, since the memory cells MC connected to arbitrary word lines WL in the memory cell arrays 21-1 to 21-4 can be replaced by redundancy, effective redundancy can be implemented. Even in the structure using a redundancy region having a small bit line length (RD cell array having a small capacity), the read signal amount of the memory cell MC almost equals that of the spare cell SMC because the capacitive element Cbadd is connected to the redundancy bit line RBL to make the bit line capacitance of the bit line BL in the main cell array 21 equivalent to that in the RD cell array 22. For this reason, a stable read can be implemented.

[Second Embodiment]

Figure 9:
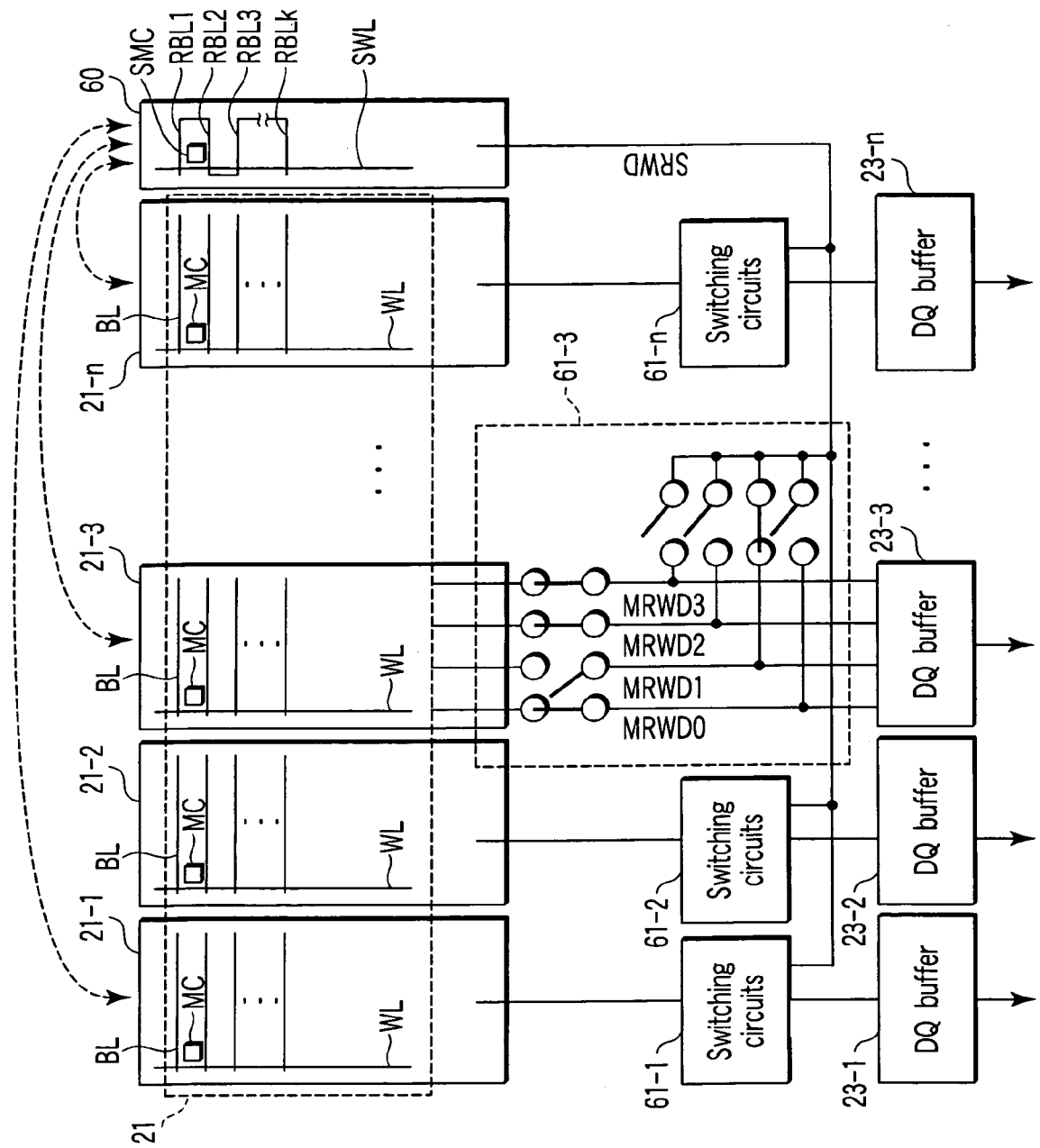
FIG. 9 is a block diagram showing the concept of redundancy in a ferroelectric memory so as to explain a semiconductor memory device according to the second embodiment of the present invention.

FIG. 9 is a block diagram schematically showing the concept of redundancy in a ferroelectric memory so as to explain a semiconductor memory device according to the second embodiment of the present invention. As in the first embodiment shown in FIG. 2, an independent redundancy cell array 60 is prepared adjacent to a main cell array 21. The main cell array 21 includes n memory cell arrays 21-1, 21-2, . . . , 21-n. DQ buffers 23-1, 23-2, . . . , 23-n are arranged in correspondence with the memory cell arrays 21-1, 21-2, . . . , 21-n. Switching circuits 61-1, 61-2, . . . , 61-n are arranged between the memory cell arrays 21-1, 21-2, . . . , 21-n and the DQ buffers 23-1, 23-2, . . . , 23-n, respectively.

A plurality of redundancy bit lines RBL1, RBL2, . . . , RBLk in the redundancy cell array 60 are connected in series in a zigzag manner. These k redundancy bit lines are selected by one column address. Accordingly, a bit line capacitance Cb in each of the memory cell arrays 21-1, 21-2, . . . , 21-n to be replaced is equivalent to a bit line capacitance Cb' in the redundancy cell array 60. The read signal amount of a memory cell MC almost equals that of a spare cell SMC.

The switching circuits 61-1, 61-2, . . . , 61-n switch to select main read/write data lines MRWD0 to MRWD3 of the memory cell arrays 21-1 to 21-n in the main cell array 21 or a spare read/write data line SRWD in the redundancy cell array 60. The memory cells MC connected to bit lines BL in the memory cell arrays 21-1 to 21-n are made to correspond to the plurality of series-connected redundancy bit lines RBL1, RBL2, . . . , RBLk so that the memory cells MC are selected as groups. When redundancy is to be executed, the switching circuits 61-1, 61-2, . . . , 61-n are controlled to select the corresponding spare read/write data line SRWD in the redundancy cell array 60. When no redundancy is to be executed, the switching circuits 61-1, 61-2, . . . , 61-n are controlled to select the main read/write data lines MRWD0 to MRWD3 in each of the memory cell arrays 21-1, 21-2, . . . , 21-n. FIG. 9 shows a state wherein data read out to the spare read/write data line SRWD is selected in place of data read out to the main read/write data line MRWD1 in the memory cell array 21-3.

Figure 10:
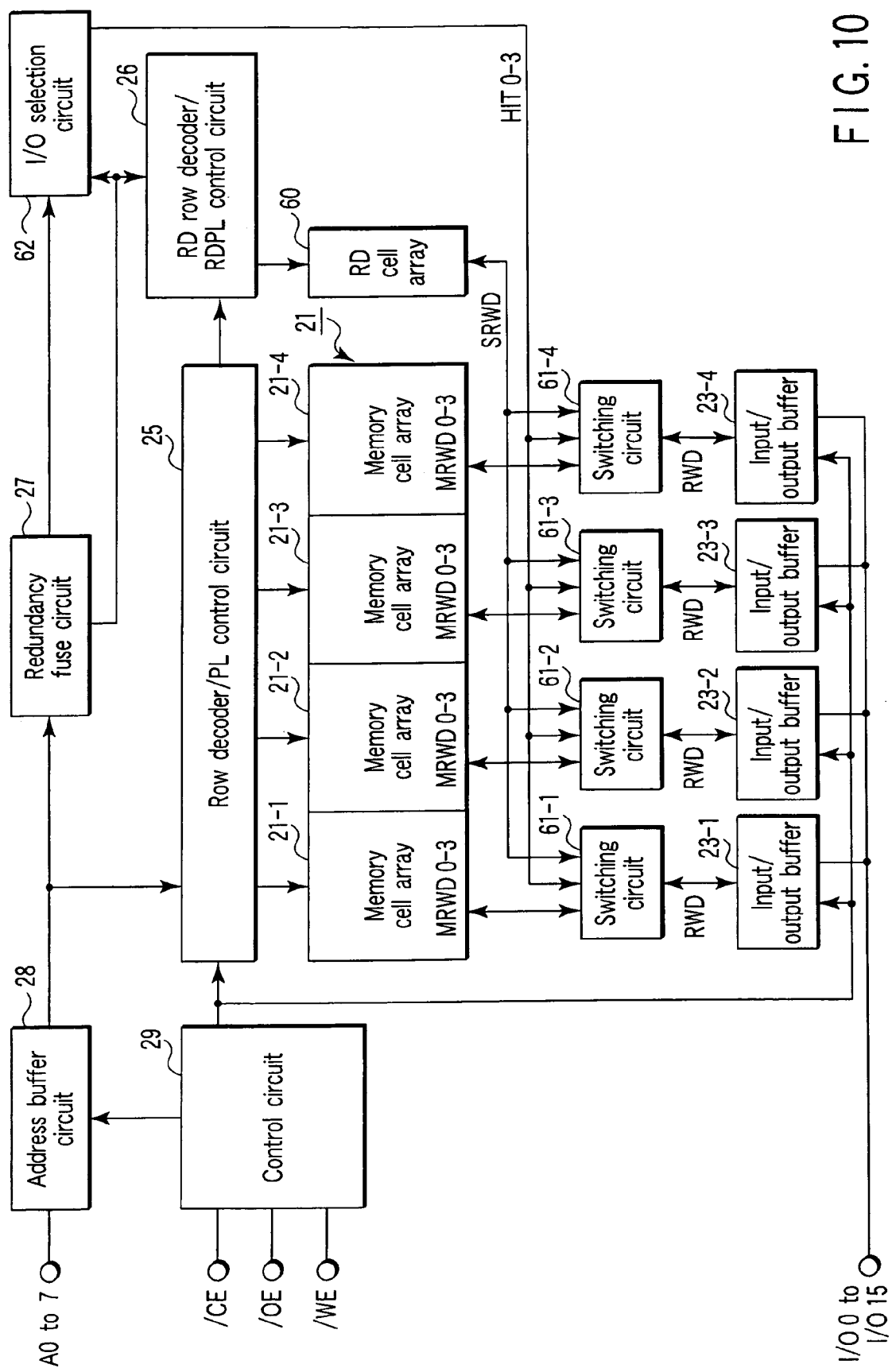
FIG. 10 is a block diagram showing the schematic arrangement of a circuit related to redundancy in a ferroelectric memory so as to explain the semiconductor memory device according to the second embodiment of the present invention.

FIG. 10 is a block diagram showing the schematic arrangement of a circuit unit related to redundancy in a ferroelectric memory so as to explain the semiconductor memory device according to the second embodiment of the present invention. This circuit includes the main cell array 21, RD (redundancy) cell array 60, row decoder/PL control circuit 25, RD row decoder/RDPL control circuit 26, redundancy fuse circuit 27, address buffer circuit 28, control circuit 29, switching circuits 61-1 to 61-4, input/output buffers 23-1 to 23-4, and I/O selection circuit 62.

Address signal bits A0 to A7 are input to the address buffer circuit 28. The output signal from the address buffer circuit 28 is supplied to the redundancy fuse circuit 27 and row decoder/PL control circuit 25. A chip enable signal /CE, output enable signal /OE, and write enable signal /WE are supplied to the control circuit 29. The control circuit 29 controls the address buffer circuit 28, row decoder/PL control circuit 25, and input/output buffers 23-1 to 23-4. The output signal from the redundancy fuse circuit 27 is supplied to the RD row decoder/RDPL control circuit 26, and I/O selection circuit 62. Output signals from the row decoder/PL control circuit 25 are supplied to the memory cell arrays 21-1 to 21-4 in the main cell array 21. One (word line driving signal) of the signals output from the row decoder/PL control circuit 25 is supplied to the RD row decoder/RDPL control circuit 26. The output signal from the RD row decoder/RDPL control circuit 26 is supplied to the RD cell array 60. Signals HIT0 to HIT3 output from the I/O selection circuit 62 are supplied to the switching circuits 61-1 to 61-4.

By the signals HIT0 to HIT3, the I/O selection circuit 62 selects the I/O, i.e., one of the main read/write data lines MRWD0 to MRWD3, which is to be replaced with a spare cell, and one of the series-connected redundancy bit lines in the RD cell array 60, which should be connected to the spare cell.

Data read out from the memory cell arrays 21-1 to 21-4 through the main read/write data lines MRWD0 to MRWD3 are supplied to the switching circuits 61-1 to 61-4. Data read out from the RD cell array 60 through the spare read/write data line SRWD is also supplied to the switching circuits 61-1 to 61-4. The data selected by the switching circuits 61-1 to 61-4 are supplied to the input/output buffers 23-1 to 23-4 through the read/write data lines RWD. The output signals from the input/output buffers 23-1 to 23-4 are output as read data I/O0 to I/O15.

On the other hand, the write data I/O0 to I/O15 input to the input/output buffers 23-1 to 23-4 are supplied to the switching circuits 61-1 to 61-4 through the read/write data lines RWD. The switching circuits 61-1 to 61-4 select whether the data should be written in the main cell array 21 or RD cell array 60. The data are written in the main cell array 21 or RD cell array 60 through the main read/write data lines MRWD0 to MRWD3 or spare read/write data lines SRWD.

Figure 11:
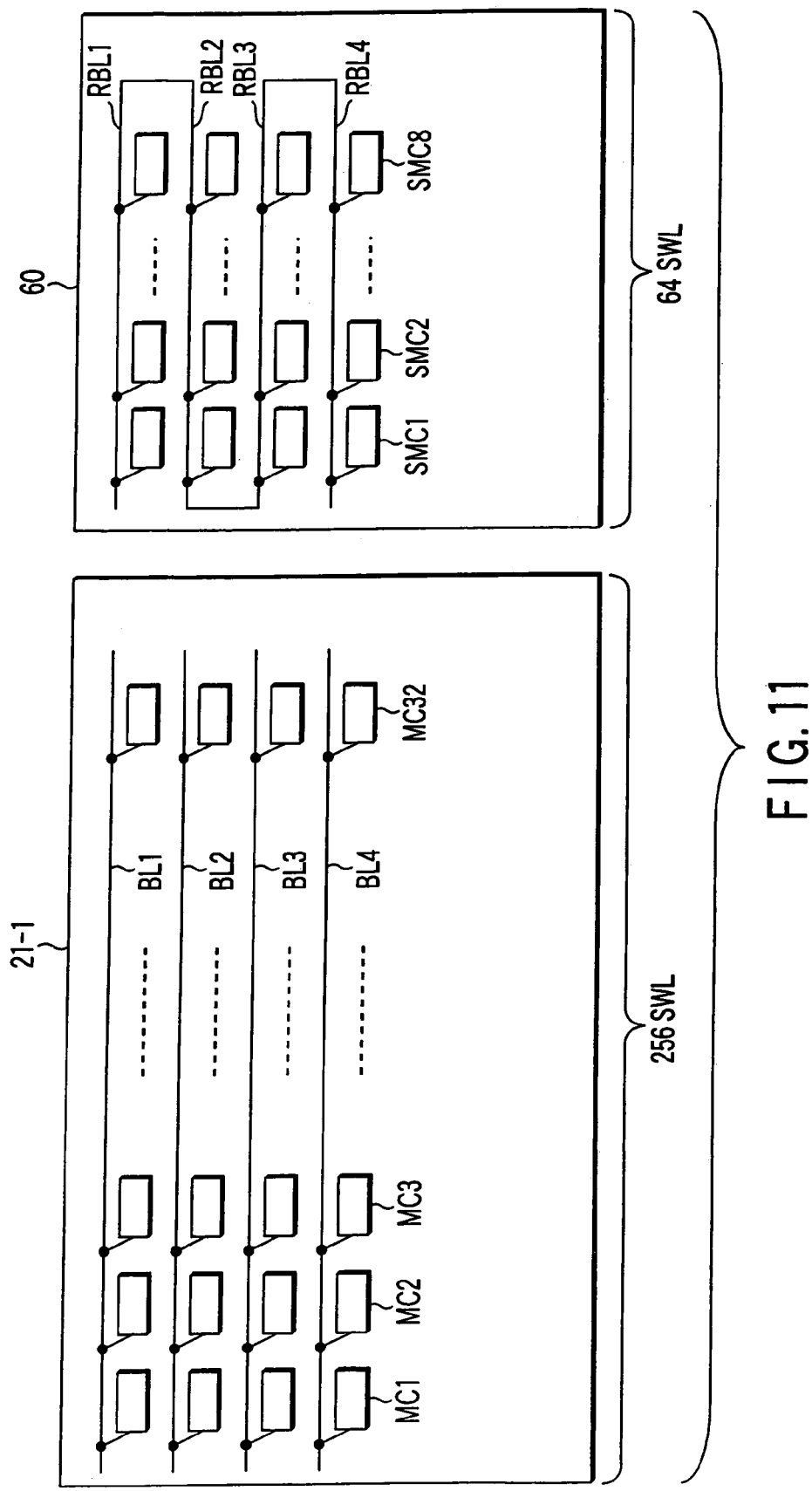
FIG. 11 is a view for explaining the structures of a main cell array and a redundancy cell array in the circuit shown in FIG. 10.

The main cell array 21 of this example includes the four memory cell arrays 21-1 to 21-4. As shown in FIG. 11, 256 word lines WL are arranged in the memory cell array 21-1 (this also applies to the memory cell arrays 21-2 to 21-4). Thirty-two series cells MC1 to MC32 are connected to each of bit lines BL1 to BL4 arranged in a direction perpendicular to the word lines WL. On the other hand, the RD cell array 60 has 64 spare word lines SWL. Eight spare cells (series cells) SMC1 to SMC8 having the same structure as in the memory cell array 21-1 are arranged on each of the redundancy bit lines RBL1 to RBL4 arranged in a direction perpendicular to the spare word lines SWL. The redundancy bit lines RBL1 to RBL4 are connected in series so that one end side and the other end side are turned in a zigzag manner.

That is, in this embodiment, the bit line length in the RD cell array 60 is ¼ that in each of the memory cell arrays 21-1 to 21-4. The redundancy bit line capacitance Cb' is ¼ the bit line capacitance Cb in the main cell array. The redundancy bit lines are connected in series in a block of four redundancy bit lines RBL1 to RBL4. The length of the four redundancy bit lines RBL1 to RBL4 which are connected in series in a zigzag manner is almost the same as the length of one bit line in each of the memory cell arrays 21-1 to 21-4. Block select transistors equal in number to the bit lines and series cells equal in number to the bit lines are connected to the redundancy bit lines. Hence, Cb=4×Cb'. The bit line capacitance in the main cell array is equivalent to that in the redundancy cell array. As a result, the read signal amount of the memory cell equals that of the spare cell. Even in the structure using a redundancy region having a small bit line length, a stable read can be implemented.

Figure 12:
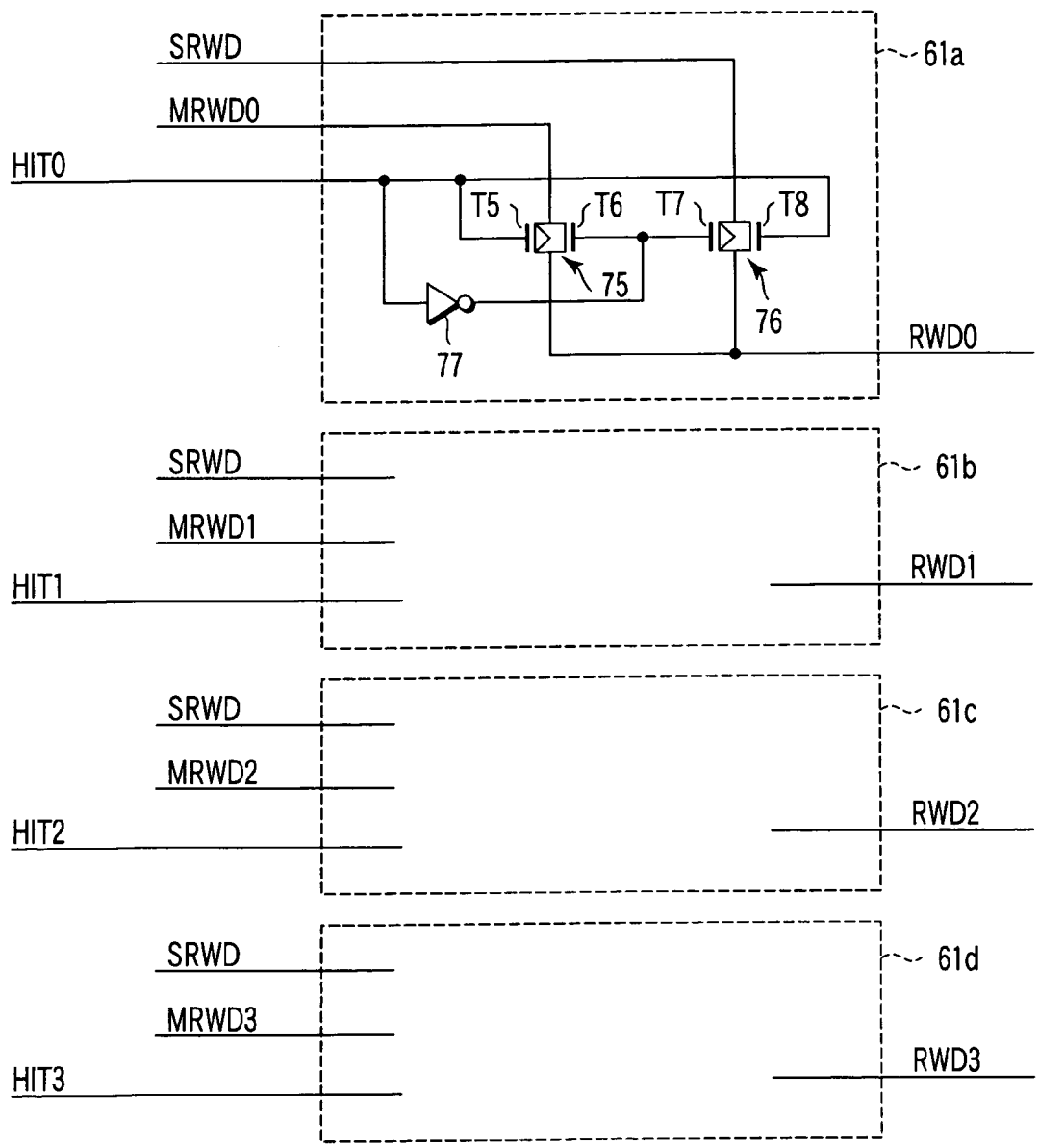
FIG. 12 is a circuit diagram showing the arrangement of a switching circuit in the circuit shown in FIG. 10.

FIG. 12 is a circuit diagram showing the arrangement of each of the switching circuits 61-1 to 61-4 in the circuit shown in FIG. 10. The switching circuits 61-1 to 61-4 respectively include switch circuits 61a to 61d. Each of the switch circuits 61a to 61d includes a first transfer gate 75 including a PMOS transistor T5 and NMOS transistor T6, a second transfer gate 76 including a PMOS transistor T7 and NMOS transistor T8, and an inverter 77.

Data read out from a memory cell array in the main cell array 21 through the main read/write data line MRWD0 is supplied to one terminal of the transfer gate 75 in the switch circuit 61a. Data read out from the RD cell array 60 through the spare read/write data line SRWD is supplied to one terminal of the transfer gate 76. The signal HIT0 output from the I/O selection circuit 62 is supplied to the gates of the MOS transistors T5 and T8. An inverted signal of the signal HIT0 is supplied from the inverter 77 to the gates of the MOS transistors T6 and T7. Accordingly, the transfer gates 75 and 76 complementarily operate so that one of the data is selected in accordance with the level of the signal HIT0 and supplied to the input/output buffer.

The remaining switch circuits 61b to 61d also basically have the same arrangement as that of the switch circuit 61a. The operations of the switch circuits 61b to 61d are controlled independently of the switch circuit 61a by the signals HIT1 to HIT3 output from the I/O selection circuit 62.

When the signals HIT0 to HIT3 are at "L" level (no defective cell is accessed), data read out from the memory cell arrays 21-1 to 21-4 to the main read/write data lines MRWD0 to MRWD3 are selected and supplied to read/write data lines RWD0 to RWD3. On the other hand, when a defective cell is accessed, and a signal selected from the signals HIT0 to HIT3 changes to "H" level, data read out from the RD cell array 60 to the spare read/write data lines SRWD are selected for each I/O and supplied to the read/write data lines RWD0 to RWD3.

The operation in the above-described arrangement will be described next. When the main cell array 21 has no defective cell, and no defective cell is accessed, the same operation as in the first embodiment is executed. That is, the main read/write data lines MRWD0 to MRWD3 are selected by the switching circuits 61-1 to 61-4. A data read or write is executed for the memory cells in the main cell array 21.

Conversely, when a defective cell in the main cell array 21 is accessed, a spare cell SMC in the RD cell array 60 is selected in place of the defective cell. The spare cells SMC are connected to the redundancy bit lines RBL1 to RBL4 connected in series, as shown in FIG. 11. For this reason, if the block select lines and spare word lines have the same layout as in the main cell array, four spare cells on the same redundancy bit line are simultaneously selected. In order to select only one of four block select transistors on the same redundancy bit line, the layout of block select transistors is modified. The spare word lines have the same layout as in the memory cell arrays 21-1 to 21-4 because even when four spare cells are simultaneously selected, only a spare cell selected by the selected block select transistor is connected to the redundancy bit line. In addition, since the redundancy cell array 60 has the redundancy bit lines connected in series, only one I/O is replaced, as shown in FIG. 9.

As described above, in the second embodiment, the I/Os in the replaced memory cell array are also switched by the switching circuits 61-1 to 61-4.

Figure 13:
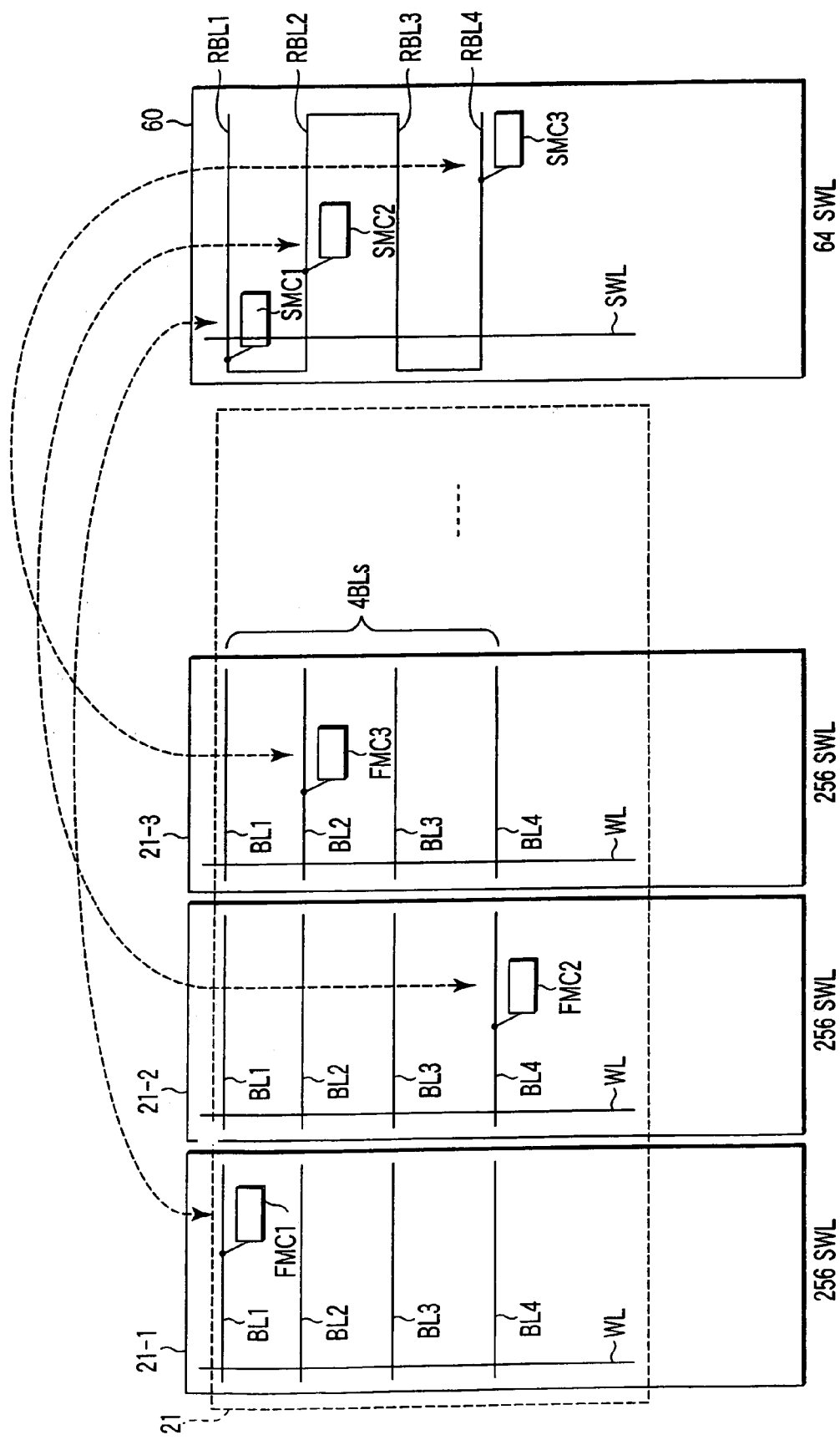
FIG. 13 is a view for explaining a replacement operation by redundancy according to the second embodiment of the present invention.

FIG. 13 shows redundancy replacement of this embodiment. A defective cell FMC1 in the memory cell array 21-1 is replaced with the spare cell SMC1 connected to the redundancy bit line RBL1 in the redundancy cell array 60, which corresponds to the bit line BL1 connected to the defective cell FMC1. A defective cell FMC2 in the memory cell array 21-2 is replaced with the spare cell SMC2 connected to the redundancy bit line RBL2 in the redundancy cell array 60, which corresponds to the bit line BL4 connected to the defective cell FMC2. A defective cell FMC3 in the memory cell array 21-3 is replaced with the spare cell SMC3 connected to the redundancy bit line RBL4 in the redundancy cell array 60, which corresponds to the bit line BL2 connected to the defective cell FMC3.

As described above, according to this embodiment, since the memory cells MC connected to arbitrary word lines WL in the memory cell arrays 21-1 to 21-4 can be replaced by redundancy, effective redundancy can be implemented. Even in the structure using a redundancy region having a small bit line length (RD cell array having a small capacity), the read signal amount of the memory cell MC almost equals that of the spare cell SMC because the plurality of redundancy bit lines RBL1 to RBL4 are connected in series to make the bit line capacitance of the bit line BL in the main cell array 21 equivalent to that in the RD cell array 60. For this reason, a stable read can be implemented.

[Third Embodiment]

Figure 14:
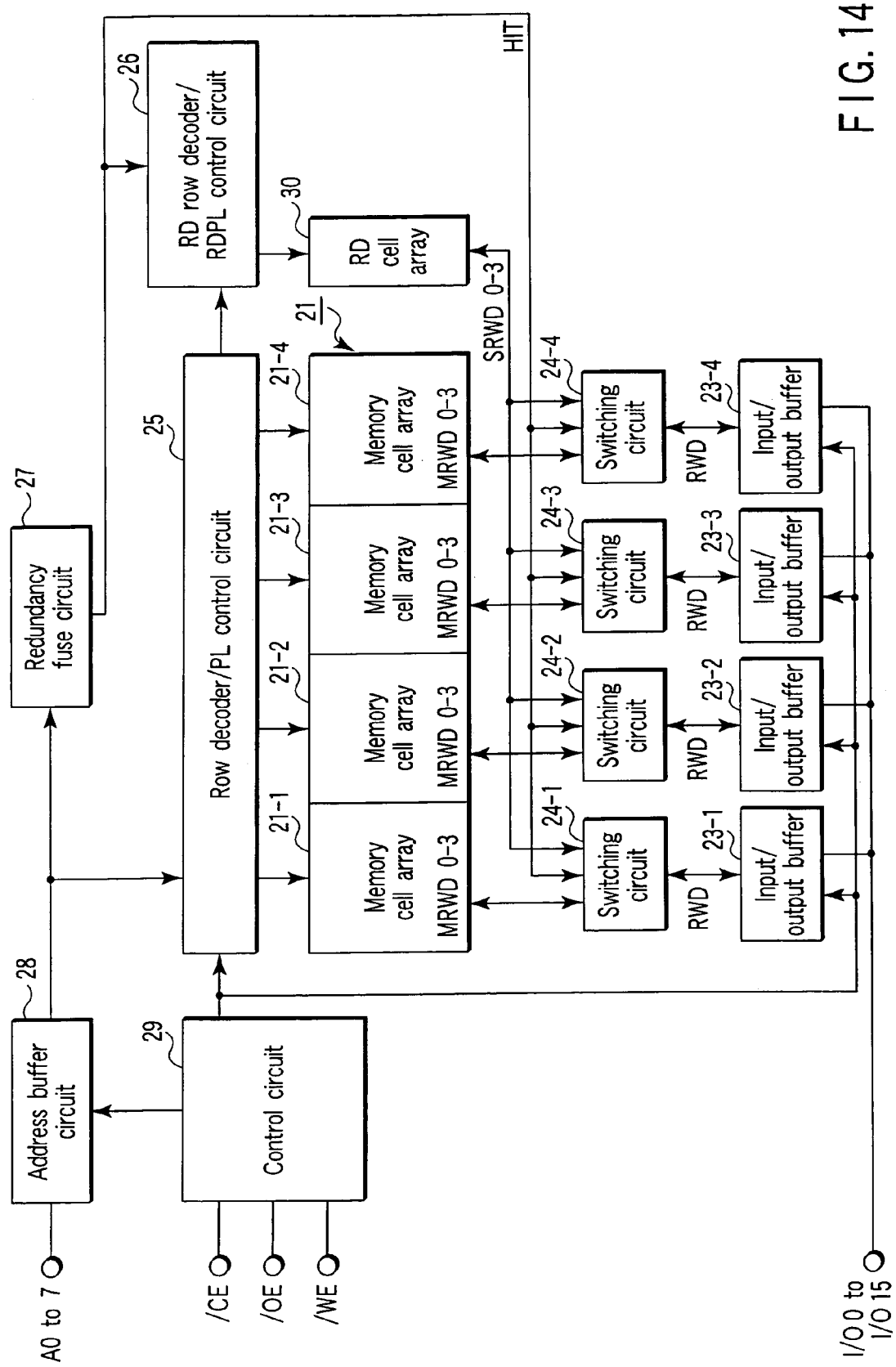
FIG. 14 is a block diagram showing the schematic arrangement of a circuit related to redundancy in a ferroelectric memory so as to explain a semiconductor memory device according to the third embodiment of the present invention.

FIG. 14 is a block diagram showing the schematic arrangement of a circuit unit related to redundancy in a ferroelectric memory so as to explain the semiconductor memory device according to the third embodiment of the present invention. This circuit includes a main cell array 21, RD (redundancy) cell array 30, row decoder/PL control circuit 25, RD row decoder/RDPL control circuit 26, redundancy fuse circuit 27, address buffer circuit 28, control circuit 29, switching circuits 24-1 to 24-4, and input/output buffers 23-1 to 23-4.

The ferroelectric memory according to the third embodiment has the same basic arrangement as in the first embodiment. The same reference numerals as in the first embodiment denote the same parts in the third embodiment, and a detailed description thereof will be omitted.

The circuit shown in FIG. 14 is different from that shown in FIG. 2 in the arrangement of the RD cell array 30. As shown in FIG. 15, a memory cell array 21-1 has 256 word lines WL (this also applies to memory cell arrays 21-2 to 21-4), as in the first and second embodiments. Thirty-two series cells MC1 to MC32 are connected to each of bit lines BL arranged in a direction perpendicular to the word lines WL. On the other hand, the RD cell array 30 has 64 spare word lines SWL. Thirty-two spare cells (series cells) SMC1 to SMC32 having a structure different from that in the memory cell array 21-1 are connected to each of redundancy bit lines RBL arranged in a direction perpendicular to the spare word lines SWL.

Figure 16A:
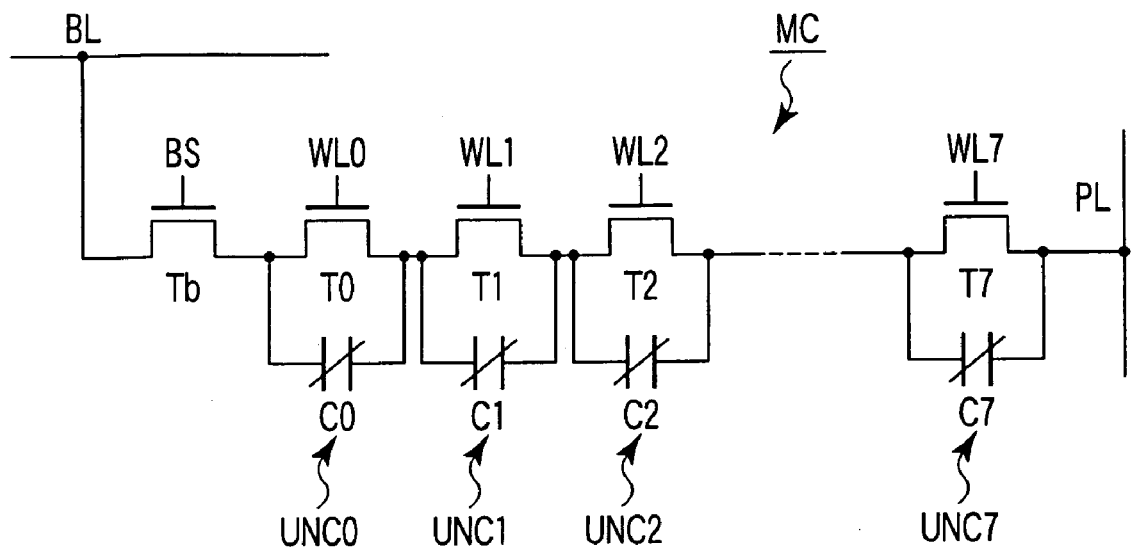
FIG. 16A is a circuit diagram showing the structure of a memory cell in the main cell array in the circuit shown in FIG. 14.

Each series cell MC in the memory cell arrays 21-1 to 21-4 includes unit cells UNC0 to UNC7 connected in series and a block select transistor Tb, as shown in FIG. 16A. In each of the unit cells UNC0 to UNC7, two terminals of a corresponding one of ferroelectric capacitors C0 to C7 are connected between the source and the drain of a corresponding one of cell transistors T0 to T7. In this example, eight unit cells are connected in series. One end of the current path of the block select transistor Tb is connected to the bit line BL. The unit cell UNC7 is connected to a plate line PL arranged in a direction perpendicular to the bit line BL. The gate of the block select transistor Tb is connected to a block select line BS arranged in a direction perpendicular to the bit line BL. The gates of the cell transistors T0 to T7 are connected to word lines WL0 to WL7 arranged in a direction perpendicular to the bit line BL, respectively.

Figure 16B:
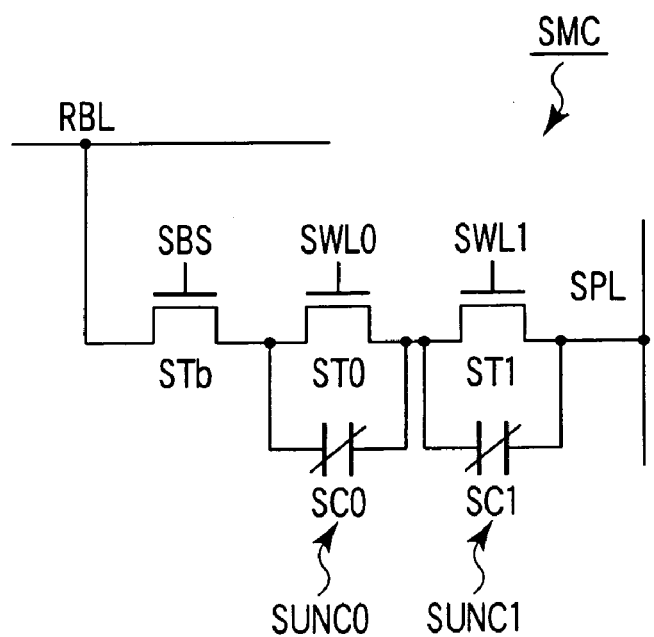
FIG. 16B is a circuit diagram showing the structure of a spare cell in the redundancy cell array in the circuit shown in FIG. 14.

As shown in FIG. 16B, each spare cell SMC in the RD cell array 30 includes unit cells SUNC0 and SUNC1 connected in series and a block select transistor STb. In each of the unit cells SUNC0 and SUNC1, two terminals of a corresponding one of ferroelectric capacitors SC0 and SC1 are connected between the source and the drain of a corresponding one of cell transistors ST0 and ST1. In this example, two unit cells are connected in series. One end of the current path of the block select transistor STb is connected to the redundancy bit line RBL. The unit cell SUNC1 is connected to a plate line SPL arranged in a direction perpendicular to the redundancy bit line RBL. The gate of the block select transistor STb is connected to a block select line SBS arranged in a direction perpendicular to the redundancy bit line RBL. The gates of the spare cell transistors ST0 and ST1 are connected to spare word lines SWL0 and SWL1 arranged in a direction perpendicular to the redundancy bit line RBL, respectively.

Figure 17:
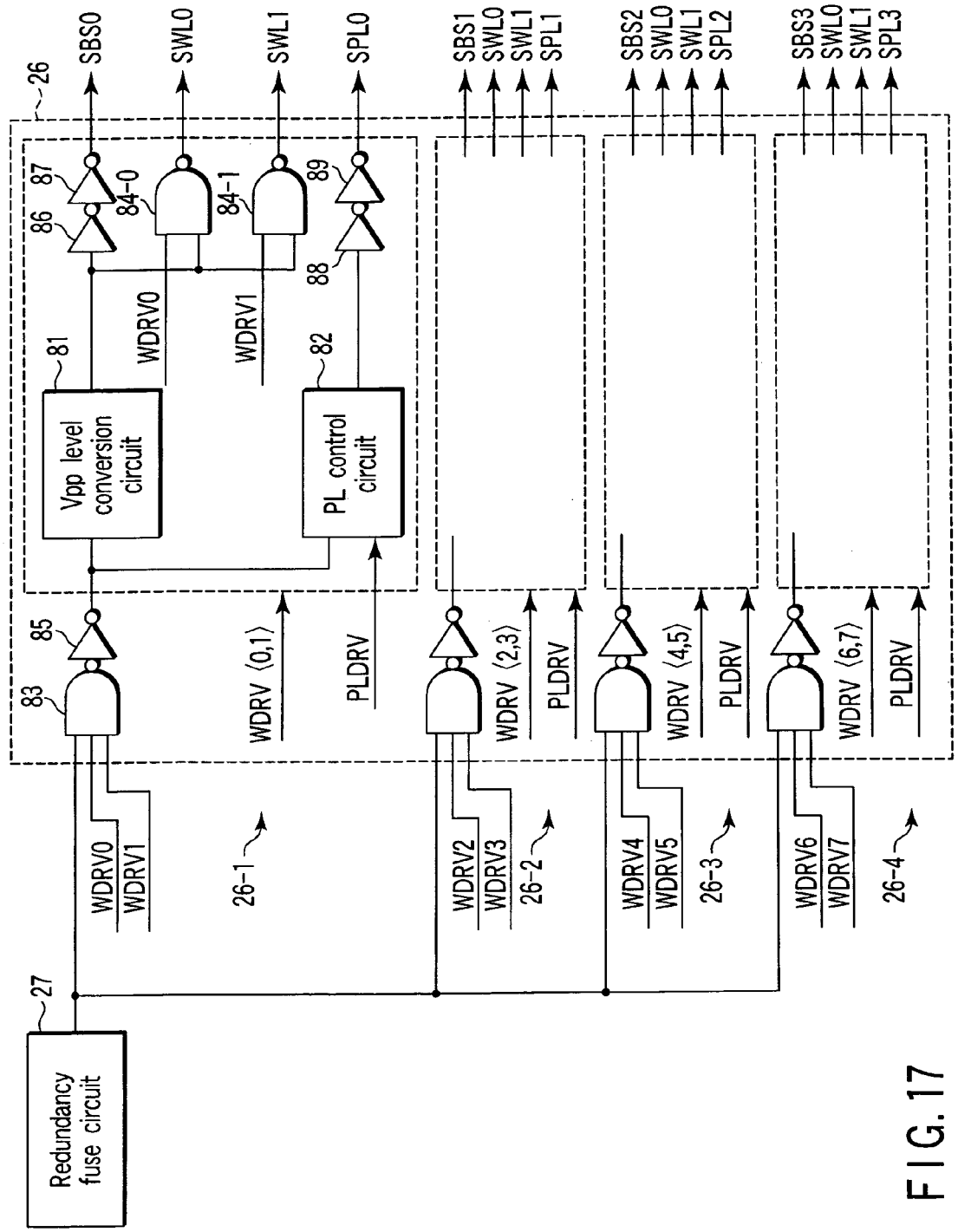
FIG. 17 is a circuit diagram showing the arrangement of an RD row decoder/RDPL control circuit in the circuit shown in FIG. 14.

FIG. 17 shows the detailed arrangement of the RD row decoder/RDPL control circuit 26 in the circuit shown in FIG. 14. The row decoder/PL control circuit 25 has the same arrangement as that of the circuit shown in FIG. 5. The RD row decoder/RDPL control circuit 26 comprises four circuit units 26-1 to 26-4 corresponding to the four redundancy bit lines RBL1 to RBL4 connected in series. The first circuit unit 26-1 drives a block select line SBS0, spare word lines SWL0 and SWL1, and plate line SPL0 in the spare cell SMC on the basis of the output signal from the redundancy fuse circuit 27, word line driving signals WDRV0 and WDRV1, and plate line driving signal PLDRV. The circuit unit 26-1 includes a Vpp level conversion circuit 81, PL control circuit 82, NAND gates 83, 84-0, and 84-1 and inverters 85 to 89. The output signal from the redundancy fuse circuit 27 and the word line driving signals WDRV0 and WDRV1 output from the row decoder/PL control circuit 25 are supplied to the NAND gate 83. The output signal from the NAND gate 83 is supplied to the Vpp level conversion circuit 81 and PL control circuit 82 through the inverter 85. The output signal from the Vpp level conversion circuit 81 is supplied to one input terminal of each of the NAND gates 84-0 and 84-1 and also supplied to the block select line SBS0 through the inverters 86 and 87. The word line driving signals WDRV0 and WDRV1 are supplied to the other input terminal of each of the NAND gates 84-0 and 84-1. The NAND gates 84-0 and 84-1 output driving signals of the spare word lines SWL0 and SWL1. The driving signal PLDRV of the plate line PL is supplied to the PL control circuit 82. The output signal from the PL control circuit 82 is supplied to the plate line SPL0 through the inverters 88 and 89.

The second circuit unit 26-2 drives a block select line SBS1, spare word lines SWL0 and SWL1, and plate line SPL1 in the spare cell SMC on the basis of the output signal from the redundancy fuse circuit 27, word line driving signals WDRV2 and WDRV3, and plate line driving signal PLDRV.

The third circuit unit 26-3 drives a block select line SBS2, spare word lines SWL0 and SWL1, and plate line SPL2 in the spare cell SMC on the basis of the output signal from the redundancy fuse circuit 27, word line driving signals WDRV4 and WDRV5, and plate line driving signal PLDRV.

The fourth circuit unit 26-4 drives a block select line SBS3, spare word lines SWL0 and SWL1, and plate line SPL3 in the spare cell SMC on the basis of the output signal from the redundancy fuse circuit 27, word line driving signals WDRV6 and WDRV7, and plate line driving signal PLDRV.

Each of the second to fourth circuit units 26-2 to 26-4 has the same circuit arrangement as that of the first circuit unit 26-1.

The switching circuits 24-1 to 24-4 have the same arrangement as that of the circuit shown in FIG. 7.

According to the above-described arrangement, the bit line length in the memory cell arrays 21-1 to 21-4 is different from the redundancy bit line length in the RD cell array 30. However, the number of block select transistors connected to the bit line is 32 in both cell arrays. When the block select transistors have the same pattern and same size, the junction capacitances are almost the same. In the bit line capacitance, the junction capacitance of the block select transistors has a large proportion. When the block select transistors are OFF, Cb=Cb' so that the capacitance of the bit line BL is almost equivalent to that of the redundancy bit line RBL. When the block select transistors are selected and turned on, the values Cb and Cb' are slightly different, though the influence is minimum in the entire ferroelectric memory. Hence, the read signal amount in the main cell array can equal that in the RD cell array. Even in the structure in which an RD cell array having a small redundancy bit line length is shared by a plurality of memory cell arrays, a stable read can be implemented.

As described above, according to the first to third embodiments of the present invention, in the ferroelectric memory, the independent redundancy cell array 22, which has a small capacity and a bit line capacitance equivalent to the bit line capacitance of the memory cell arrays 21-1, 21-2, . . . , 21-n in the main cell array 21, is prepared. Hence, a stable read operation can be performed. In addition, since the redundancy cell array 11 is shared by the memory cell arrays 21-1, 21-2, . . . , 21-n, flexible redundancy can be implemented. Since the degree of freedom of remedy increases, the remedy efficiency can be increased. Furthermore, since the pattern occupation area of the redundancy cell region can be reduced without decreasing the remedy efficiency, and the chip size can be reduced, the cost can also be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising: a main cell array which includes a plurality of memory cell arrays, the memory cell arrays having ferroelectric cells arranged at intersections between word lines and bit lines;
a redundancy cell array which is arranged independently of the main cell array and shared by said plurality of memory cell arrays,
the redundancy cell array having spare ferroelectric cells arranged at intersections between spare word lines and redundancy bit lines,
the spare ferroelectric cells connected to the redundancy bit line being smaller in number than the ferroelectric cells connected to the bit line in memory cell arrays in the main cell array;
a correction capacitance which is connected to the redundancy bit line to make a capacitance of the redundancy bit line equivalent to that of the bit line; and
switching circuits which are arranged in correspondence with the memory cell arrays and configured to, when a replaced ferroelectric cell in the main cell array is selected, select a corresponding spare ferroelectric cell in place of the replaced ferroelectric cell;
an address buffer circuit to which an address signal is input;
a redundancy fuse circuit which receives an output signal from the address buffer circuit, the redundancy fuse circuit storing an address of a defective cell in the main cell array;
a row decoder/PL control circuit which receives the output signal from the address buffer circuit and an output signal from a control circuit and selectively drives the word lines and a plate line in the main cell array; and
a RD row decoder/RDPL control circuit which receives the output signal from the redundancy fuse circuit and an output signal from the row decoder/PL control circuit and selectively drives the spare word lines and a spare plate line in the redundancy cell array,
wherein when the address of the defective cell, which is stored in the redundancy fuse circuit, is selected, the switching circuits select the spare ferroelectric cells.

2. A device according to claim 1, wherein the ferroelectric cells in the memory cell arrays comprises a plurality of first unit cells connected in series, and
a first block select transistor which connects the first unit cells to the bit line in response to a first block select signal,
the ferroelectric cells in the redundancy cell array comprises a plurality of second unit cells connected in series, and a second block select transistor which connects the second unit cells to the redundancy bit line in response to a second block select signal, and
the first unit cells and the second unit cells has a cell transistor and a ferroelectric capacitor whose two terminals are connected between a source and a drain of the cell transistor.

3. A device according to claim 1, wherein the correction capacitance includes at least one of a ferroelectric capacitor, a linear capacitor, and a parasitic capacitance, in which one electrode is connected to the redundancy bit line, and the other electrode is connected to a ground potential.

4. A device according to claim 1, wherein the switching circuits selects, on the basis of fuse data which stores an address of a defective cell, one of data read out from a corresponding memory cell array through a main read/write data line and data read out from the redundancy cell array through a spare read/write data line.

5. A device according to claim 1, further comprising input/output buffers which are arranged in correspondence with the switching circuits and connected to the switching circuits through read/write data lines,
wherein the control circuit controls the address buffer circuit, the row decoder/PL control circuit, and the input/output buffers.

6. A device according to claim 5, wherein the switching circuits comprises a first transfer gate which is arranged between a main read/write data line and the read/write data line and controlled on the basis of a signal representing that a defective address output from the redundancy fuse circuit is accessed, and a second transfer gate which is arranged between a spare read/write data line and the read/write data line and controlled on the basis of an inverted signal of the signal representing that the defective address output from the redundancy fuse circuit is accessed.

7. A semiconductor memory device comprising:
a main cell array which includes a plurality of memory cell arrays, the memory cell arrays having ferroelectric cells arranged at intersections between word lines and bit lines;
a redundancy cell array which is arranged independently of the main cell array and shared by said plurality of memory cell arrays, the redundancy cell array having spare ferroelectric cells arranged at intersections between spare word lines and redundancy bit lines, the spare ferroelectric cells connected to the redundancy bit line being smaller in number than the ferroelectric cells connected to the bit line in memory cell arrays in the main cell array, and the redundancy cell array including a plurality of redundancy bit lines which are connected in series to make a capacitance of the bit line equivalent to that of the redundancy bit line; and switching circuits which are arranged in correspondence with the memory cell arrays and configured to, when a replaced ferroelectric cell in the main cell array is selected, select a corresponding spare ferroelectric cell in place of the replaced ferroelectric cell.

8. A device according to claim 7, wherein
the ferroelectric cells in the memory cell arrays comprises a plurality of first unit cells connected in series, and a first block select transistor which connects the first unit cells to the bit line in response to a first block select signal,
the ferroelectric cells in the redundancy cell array comprises a plurality of second unit cells connected in series, and a second block select transistor which connects the second unit cells to the redundancy bit line in response to a second block select signal, and
the first unit cells and the second unit cells has a cell transistor and a ferroelectric capacitor whose two terminals are connected between a source and a drain of the cell transistor.

9. A device according to claim 7, wherein the switching circuits selects, on the basis of fuse data which stores an address of a defective cell, one of data read out from a corresponding memory cell array through a main read/write data line and data read out from the redundancy cell array through a spare read/write data line.

10. A device according to claim 7, which further comprises an address buffer circuit to which an address signal is input,
a redundancy fuse circuit which receives an output signal from the address buffer circuit, the redundancy fuse circuit storing an address of a defective cell in the main cell array,
a row decoder/PL control circuit which receives the output signal from the address buffer circuit and an output signal from a control circuit and selectively drives the word lines and a plate line in the main cell array,
an RD row decoder/RDPL control circuit which receives the output signal from the redundancy fuse circuit and an output signal from the row decoder/PL control circuit and selectively drives the spare word lines and a spare plate line in the redundancy cell array, and
an I/O selection circuit which is configured to receive the output signal from the redundancy fuse circuit and an output signal from the RD row decoder/RDPL control circuit and control an operation of the switching circuits, and
in which the switching circuits execute a selection operation on the basis of an output signal from the I/O selection circuit.

11. A device according to claim 10, further comprising input/output buffers which are arranged in correspondence with the switching circuits and connected to the switching circuits through read/write data lines,
wherein the control circuit controls the address buffer circuit, the row decoder/PL control circuit, and the input/output buffers.

12. A device according to claim 11, wherein the switching circuits comprise a plurality of switch circuits which are controlled for bits on the basis of a signal representing that a defective address output from the I/O selection circuit is accessed, the switch circuit comprising a first transfer gate which is arranged between a main read/write data line and the read/write data line and controlled for bits on the basis of the signal representing that the defective address output from the I/O selection circuit is accessed, and a second transfer gate which is arranged between a spare read/write data line and the read/write data line and controlled on the basis of an inverted signal of the signal representing that the defective address output from the I/O selection circuit is accessed.

13. A device according to claim 7, wherein said plurality of redundancy bit lines are connected in series in a zigzag manner.

14. A semiconductor memory device comprising:
a main cell array which includes a plurality of memory cell arrays, the memory cell arrays having ferroelectric cells arranged at intersections between word lines and bit lines, the ferroelectric cells comprising i first unit cells connected in series, and a first block select transistor which selects the first unit cells, and the first unit cells having a cell transistor and a ferroelectric capacitor whose two terminals are connected between a source and a drain of the cell transistor;
a redundancy cell array which is arranged independently of the main cell array and shared by said plurality of memory cell arrays, the redundancy cell array having spare ferroelectric cells arranged at intersections between spare word lines and redundancy bit lines, the spare ferroelectric cells comprising j (j<i) second unit cells connected in series, and a second block select transistor which selects the second unit cells, and the second unit cells having a cell transistor and a ferroelectric capacitor whose two terminals are connected between a source and a drain of the cell transistor; and
switching circuits which are arranged in correspondence with the memory cell arrays and configured to, when a replaced ferroelectric cell in the main cell array is selected, select a corresponding spare ferroelectric cell in place of the replaced ferroelectric cell,
wherein the first block select transistors connected to bit lines in memory cell arrays in the main cell array are equal in number to the second block select transistors connected to redundancy bit lines in the redundancy cell array.

15. A device according to claim 14, wherein the switching circuits selects, on the basis of fuse data which stores an address of a defective cell, one of data read out from a corresponding memory cell array through a main read/write data line and data read out from the redundancy cell array through a spare read/write data line.

16. A device according to claim 14, which further comprises an address buffer circuit to which an address signal is input,
a redundancy fuse circuit which receives an output signal from the address buffer circuit, the redundancy fuse circuit storing an address of a defective cell in the main cell array,
a row decoder/PL control circuit which receives the output signal from the address buffer circuit and an output signal from the control circuit and selectively drives the word lines and a plate line in the main cell array, and
an RD row decoder/RDPL control circuit which receives the output signal from the redundancy fuse circuit and an output signal from the row decoder/PL control circuit and selectively drives the spare word lines and a spare plate line in the redundancy cell array, and in which when the address of the defective cell, which is stored in the redundancy fuse circuit, is selected, the switching circuits select the spare ferroelectric cells.

17. A device according to claim 16, further comprising input/output buffers which are arranged in correspondence with the switching circuits and connected to the switching circuits through read/write data lines, and a control circuit which controls the address buffer circuit, the row decoder/PL control circuit, and the input/output buffers.

18. A device according to claim 17, wherein the switching circuits comprises a first transfer gate which is arranged between a main read/write data line and the read/write data line and controlled on the basis of a signal representing that a defective address output from the redundancy fuse circuit is accessed, and a second transfer gate which is arranged between a spare read/write data line and the read/write data line and controlled on the basis of an inverted signal of the signal representing that the defective address output from the redundancy fuse circuit is accessed.

* * * * *